(12) United States Patent
Cho et al.

(10) Patent No.: US 12,307,650 B2
(45) Date of Patent: May 20, 2025

(54) SCANNING ELECTRON MICROSCOPE DEVICE, SEMICONDUCTOR MANUFACTURING DEVICE, AND METHOD OF CONTROLLING SEMICONDUCTOR MANUFACTURING DEVICE

(71) Applicant: Samsung Electronics Co., Ltd., Suwon-si (KR)

(72) Inventors: Yunje Cho, Seoul (KR); Subong Shon, Suwon-si (KR); Myungjun Lee, Seongnam-si (KR); Taehyoung Lee, Suwon-si (KR); Yeny Yim, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 382 days.

(21) Appl. No.: 17/826,320

(22) Filed: May 27, 2022

(65) Prior Publication Data

US 2023/0074302 A1 Mar. 9, 2023

(30) Foreign Application Priority Data

Sep. 8, 2021 (KR) ................ 10-2021-0119819

(51) Int. Cl.
 *G06T 7/73* (2017.01)
 *G06T 1/20* (2006.01)
 (Continued)

(52) U.S. Cl.
 CPC .............. *G06T 7/0006* (2013.01); *G06T 1/20* (2013.01); *G06T 7/73* (2017.01); *G06V 10/7715* (2022.01);
 (Continued)

(58) Field of Classification Search
 CPC ........... G06T 7/0006; G06T 1/20; G06T 7/73; G06T 2207/10061; G06T 2207/10148;
 (Continued)

(56) References Cited

U.S. PATENT DOCUMENTS 6,137,113 A * 10/2000 Muraki ................. B82Y 40/00
 250/492.23
2002/0053634 A1* 5/2002 Watanabe ........... H01J 37/3174
 250/201.2

(Continued)

FOREIGN PATENT DOCUMENTS

KR 20060013726 A * 2/2006
KR 20070077288 A * 7/2007
 (Continued)

*Primary Examiner* — Henok Shiferaw
*Assistant Examiner* — Woo C Rhim
(74) *Attorney, Agent, or Firm* — Harness, Dickey & Pierce, P.L.C.

(57) ABSTRACT

A scanning electron microscope (SEM) device includes: an electron beam source configured to emit an electron beam; a lens unit disposed between the electron beam source and a stage configured to seat an object including structures having a pattern is seated, and including a scanning coil, the scanning coil configured to generate an electromagnetic field to provide a lens, and an astigmatism adjuster; and a control unit. The control unit is configured to change a working distance between the lens unit and the object to obtain a plurality of original images, obtain a pattern image, in which the structures appear, and a plurality of kernel images, in which a distribution of the electron beam on the object appears, from the plurality of original images, and control the astigmatism adjuster to adjust the focus and the astigmatism of the lens unit using feature values extracted from the plurality of kernel images.

18 Claims, 25 Drawing Sheets

(51) Int. Cl.
*G06T 7/00* (2017.01)
*G06V 10/77* (2022.01)

(52) U.S. Cl.
CPC ............... *G06T 2207/10061* (2013.01); *G06T 2207/10148* (2013.01); *G06T 2207/30148* (2013.01)

(58) Field of Classification Search
CPC ...... G06T 2207/30148; G06V 10/7715; G06V 20/695; G06V 20/693; G06V 2201/122; H01J 2237/1532; H01J 2237/216; H01J 2237/2817; H01J 37/153; H01J 37/28
See application file for complete search history.

(56) References Cited

U.S. PATENT DOCUMENTS

| | | |
|---|---|---|
| 2005/0127293 A1 | 6/2005 | Kim et al. |
| 2005/0161601 A1* | 7/2005 | Kochi ............... G01N 23/2251 250/311 |
| 2005/0258366 A1* | 11/2005 | Honda ............... H01J 37/21 250/310 |
| 2006/0060781 A1* | 3/2006 | Watanabe ............ B82Y 40/00 250/310 |
| 2006/0278826 A1 | 12/2006 | Roberts et al. |
| 2008/0093551 A1* | 4/2008 | Tsuneta ............... G06T 5/80 382/255 |
| 2008/0099697 A1* | 5/2008 | Watanabe ............ H01J 37/026 250/492.22 |
| 2008/0237461 A1* | 10/2008 | Kim ................ H01J 37/222 250/307 |
| 2009/0032693 A1* | 2/2009 | Kakuta ............... H01J 37/1471 250/311 |
| 2010/0001186 A1* | 1/2010 | Hwang ............... H01J 37/21 250/311 |
| 2010/0320382 A1 | 12/2010 | Almogy et al. |
| 2011/0234610 A1 | 9/2011 | Kim et al. |
| 2011/0274341 A1* | 11/2011 | Shirahata ............ H01J 37/28 382/145 |
| 2013/0026361 A1* | 1/2013 | Yamanashi ............ G06T 7/74 250/306 |
| 2014/0192166 A1 | 7/2014 | Cogswell et al. |
| 2015/0287201 A1* | 10/2015 | Shinoda ............... G06T 7/337 382/144 |
| 2015/0287568 A1* | 10/2015 | Rodgers ............. H01J 37/261 250/397 |
| 2016/0123897 A1* | 5/2016 | Pavani ............... G06T 7/001 348/126 |
| 2016/0180190 A1* | 6/2016 | Lifshin ............... H01J 37/28 382/201 |
| 2017/0084424 A1 | 3/2017 | Masnaghetti et al. |
| 2017/0345615 A1* | 11/2017 | Zotta ................ G06T 5/00 |
| 2019/0006145 A1 | 1/2019 | Kaneko |
| 2019/0172675 A1* | 6/2019 | Masnaghetti ......... G02B 21/20 |
| 2020/0004138 A1* | 1/2020 | Budach ............... G03F 1/72 |
| 2020/0088658 A1* | 3/2020 | Quemere ............ G01N 23/2251 |
| 2020/0241276 A1 | 7/2020 | Dai et al. |
| 2020/0286709 A1* | 9/2020 | Shiratsuchi ........... H01J 37/22 |
| 2020/0312613 A1* | 10/2020 | Welte ................ H01J 37/222 |
| 2020/0365364 A1* | 11/2020 | Shintani ............. H01J 37/28 |
| 2021/0350113 A1* | 11/2021 | Sjögren et al. ........ G06F 18/22 |
| 2022/0028647 A1* | 1/2022 | Floresca ............ H01J 37/21 |
| 2022/0115203 A1* | 4/2022 | Bizen ................ H01J 37/1472 |
| 2022/0164917 A1* | 5/2022 | Anantaraman .......... G06F 9/54 |
| 2022/0383446 A1* | 12/2022 | Traversa .............. G06T 1/20 |
| 2022/0392737 A1* | 12/2022 | Otsuka ............... H01J 37/244 |
| 2023/0023939 A1* | 1/2023 | Kuiper .............. G06T 7/0006 |
| 2024/0005463 A1* | 1/2024 | Hasan ................ G06T 5/10 |

FOREIGN PATENT DOCUMENTS

| | | |
|---|---|---|
| KR | 100846635 B1 * | 7/2008 |
| KR | 20100003643 A * | 1/2010 |
| KR | 10-0983548 B1 | 9/2010 |
| KR | 10-2011-0108727 A | 10/2011 |
| KR | 10-2014-0057190 A | 5/2014 |
| KR | 10-2018-0049099 A | 5/2018 |
| WO | WO-2012-161829 A2 | 11/2012 |

\* cited by examiner

SCANNING ELECTRON MICROSCOPE DEVICE, SEMICONDUCTOR MANUFACTURING DEVICE, AND METHOD OF CONTROLLING SEMICONDUCTOR MANUFACTURING DEVICE

CROSS-REFERENCE TO RELATED APPLICATION(S)

This application claims benefit of priority to Korean Patent Application No. 10-2021-0119819 filed on Sep. 8, 2021 in the Korean Intellectual Property Office, the disclosure of which is incorporated herein by reference in its entirety.

BACKGROUND

The present disclosure relates to a scanning electron microscope device, a semiconductor manufacturing device, and a method of controlling the semiconductor manufacturing device.

For a device using an electron beam, such as a scanning electron microscope (SEM) device, it is desired to accurately irradiate the electron beam to an object to be analyzed and/or an object to be processed. The electron beam, emitted from an electron beam source, passes through a condenser lens formed by an electromagnetic field and is incident on the target. However, a significant amount of time may be required to manually adjust focus and astigmatism, so that efficiency of process may be reduced.

SUMMARY

Example embodiments provide a scanning electron microscope device, a semiconductor manufacturing device, and a method of controlling the semiconductor manufacturing device, which may adjust and simultaneously optimize or improve focus and astigmatism to improve process efficiency.

According to an example embodiment, a scanning electron microscope (SEM) device includes: an electron beam source configured to emit an electron beam; a lens unit disposed between the electron beam source and a stage configured to seat an object including structures having a pattern is seated, and including a scanning coil. The scanning coil is configured to generate an electromagnetic field to provide a lens. The lens unit includes an astigmatism adjuster. The control unit is configured to change a working distance between the lens unit and the object to obtain a plurality of original images, obtain a pattern image, in which the structures appear, and a plurality of kernel images, in which a distribution of the electron beam on the object appears, from the plurality of original images, and control the astigmatism adjuster to adjust a focus and the astigmatism of the lens unit using feature values extracted from the plurality of kernel images.

According to an example embodiment, a semiconductor manufacturing device includes: an electron beam source configured to emit an electron beam to an object; a lens unit between the object and the electron beam source; and a control unit configured to change a working distance between the lens unit and the object to obtain a plurality of original images, to obtain a plurality of kernel images, in which a distribution of the electron beam focused on the object is represented in a form of a point spread function, from the plurality of original images, and to improve the working distance and an astigmatism of the lens unit based on feature values extracted from the plurality of kernel images.

According to an example embodiment, a method of controlling a semiconductor manufacturing device, including an electron beam source configured to irradiate an electron beam to an object and a lens unit arranged to be between the electron beam source and the object, is provide. The method includes: adjusting a working distance between the lens unit and the object to obtain a plurality of original images; obtaining a plurality of kernel images from the original images, the plurality of kernel images including a single pattern image including structures included in the object and a distribution of the electron beam in the object; extracting feature values from the plurality of kernel images; mapping the feature values to a two-dimensional plane; and determining a compensation direction for adjusting astigmatism of the lens unit with reference to a representative vector generated using vectors, connecting the feature values to each other, in the two-dimensional plane.

BRIEF DESCRIPTION OF DRAWINGS

The above and other aspects, features, and advantages of the present disclosure is more clearly understood from the following detailed description, taken in conjunction with the accompanying drawings.

DETAILED DESCRIPTION

Hereinafter, example embodiments are described with reference to the accompanying drawings.

Figure 1:
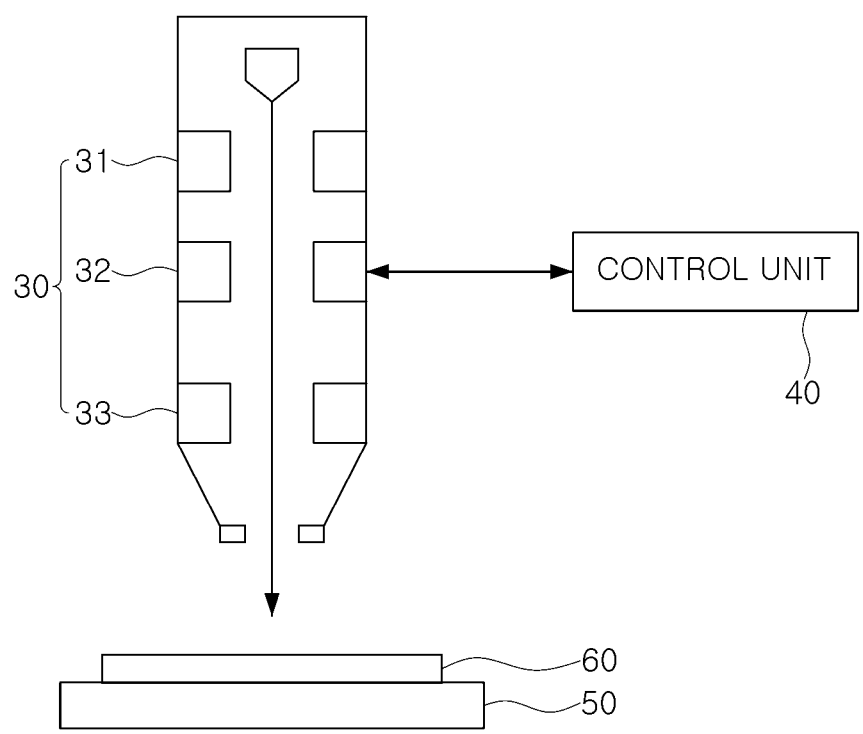
FIG. 1 is a schematic diagram of a semiconductor manufacturing device according to an example embodiment.

FIG. 1 is a schematic diagram of a semiconductor manufacturing device according to an example embodiment.

The semiconductor manufacturing device according to an example embodiment illustrated in FIG. 1 may be a scanning electron microscope (SEM) device 10. Referring to FIG. 1, the SEM device 10 according to an embodiment of the present invention may include an electron beam source 20, a lens unit 30, a control unit 40, and the like. The SEM device 10 may obtain an image of an object 60 by irradiating an electron beam to an object 60, seated on a stage 50, and collecting signals emitted from the object 60. For example, a signal emitted from the object 60 by an electron beam irradiated to the object 60 may include secondary electrons (SE), back-scattered electrons (BSE), X-rays, visible rays, and cathode fluorescent lights, and the like.

The electron beam source 20 may generate and emit an electron beam, and the electron beam emitted from the electron beam source 20 may be accelerated and focused by the lens unit 30 to be irradiated to the object 60. As an example, the electron beam source 20 may include an electron gun. The electron gun may heat a filament, formed of tungsten or the like, to generate electrons and may apply a voltage to the electrons to accelerate an electron beam.

The lens unit 30 may include a first focusing lens 31, a second focusing lens 32, an objective lens 33, and the like. The first and second focusing lenses 31 and 32 may focus the electron beam, emitted from the electron beam source 20, such that the electron beam is effectively focused on a single point of the object 60. As an example, the smaller a diameter of the electron beam irradiated to the object 60, the higher a resolution of an image obtained by the controller 40. In addition, the lens unit 30 may include two or more focusing lenses 31 and 32 to increase the resolution of the image. The electron beam, emitted from the electron beam source 20, may gradually decrease in diameter while passing through the first and second focusing lenses 31 and 32.

The objective lens 33 may focus the electron beam, focused by the first and second focusing lenses 31 and 32, on the object 60. For example, the objective lens 33 may determine the intensity of the electron beam irradiated to the object 60. A distance between the objective lens 33 and the object 60 may be defined as a working distance, and the diameter of the electron beam irradiated to the object 60 may vary depending on the working distance. Thus, a position of the objective lens 33 may be adjusted to adjust the resolution of an image corresponding to the object 60.

The objective lens 33 may include a plurality of coils, and a scanning angle and/or scanning direction of the electron beam irradiated to the object 60 may be changed by current flowing to the coils. As an example, the degree of refraction of the electron beam may vary depending on the current flowing to the coils. As described above, a distribution of the electron beam irradiated to the object 60 may be changed by astigmatism of the lens unit 30. As a result, the astigmatism of the lens unit 30 may be adjusted by a method, such as adjustment of the current flowing to the coils, to accurately irradiate the electron beam in a desired shape to the object 60.

However, the focus and the astigmatism of the lens unit 30 may be parameters which affect each other. For example, when the working distance between the objective lens 33 and the object 60 are adjusted such that the lens unit 30 has a desired focus and the current flowing to the coils of the objective lens 33 is then adjusted to adjust the astigmatism, the focus may be shifted during the adjustment of the astigmatism. Accordingly, the focus and astigmatism of the lens unit 30 may be simultaneously optimized or improved.

When an operator manually adjusts the focus and the astigmatism of the lens unit 30, a large amount of time of tens of minutes may be required to optimize or improve the focus and the astigmatism. In an example embodiment, the focus and the astigmatism of the lens unit 30 may be automatically and simultaneously optimized or improved. In addition, the focus and the astigmatism of the lens unit 30 may be optimized or improved irrespective of patterns of structures included in the object 60 to be checked by the SEM device 10, so that efficiency of process using a semiconductor manufacturing device using the SEM device or an electron beam, or the like, may be improved.

As an example, the control unit 40 may obtain a plurality of original images of the object 60 while adjusting the working distance between the objective lens 33 and the object 60. Some of the plurality of original images, obtained while adjusting the working distance, may be out-of-focus images. The control unit 40 may obtains a pattern image, in which structures included in the object 60 appear, and a plurality of kernel images, in which a shape and a distribution of an electron beam in the object 60 appear in the object 60, from the plurality of original images and may automatically optimize or improve the focus and the astigmatism of the lens unit 30 based on feature values extracted from the images.

Figure 2:
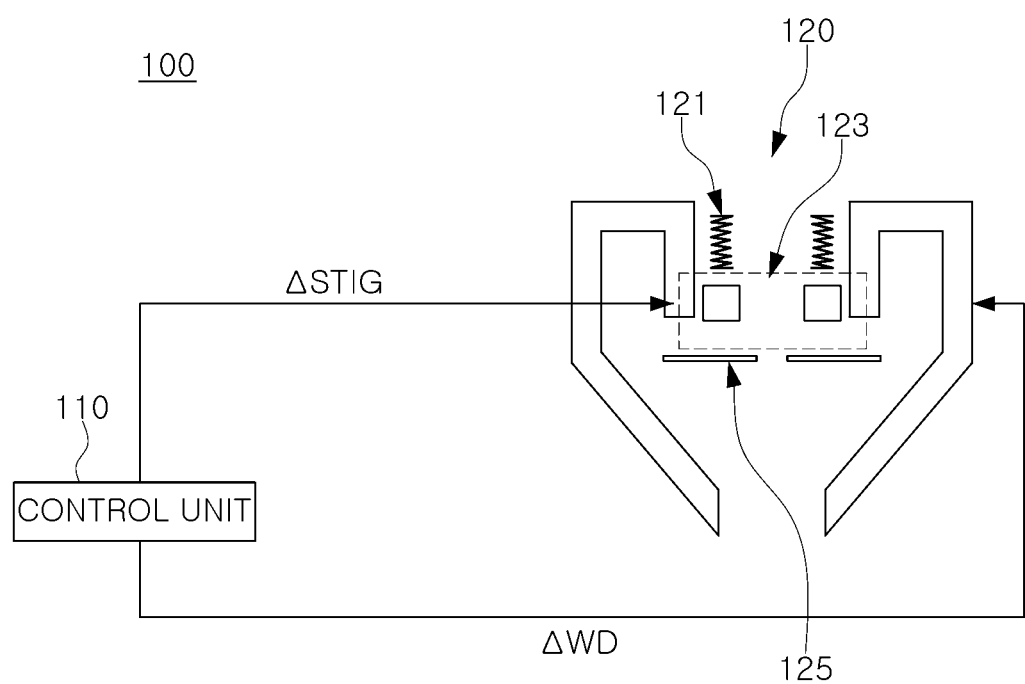
FIG. 2 is a diagram illustrating an operation of a semiconductor manufacturing device according to an example embodiment.

FIG. 2 is a diagram illustrating an operation of a semiconductor manufacturing device according to an example embodiment.

Referring to FIG. 2, a semiconductor production apparatus 100 may include a control unit 110, an objective lens 120, and the like, and the objective lens 120 may include a plurality of scanning coils 121, an astigmatism adjuster 123, an aperture 125, and the like. The plurality of scanning coils 121 may deflect the electron beam to a single point of the objective lens 120. The astigmatism adjuster 123 may include a plurality of stigmators and may adjust current, flowing to the stigmators, to adjust the astigmatism of the electron beam passing through the objective lens 120.

The control unit 110 may output a first control signal $\Delta WD$ and a second control signal $\Delta STIG$ to the objective lens 120. The first control signal $\Delta WD$ may be a signal for adjusting the working distance of the objective lens 120, and the objective lens 120 may be moved by the first control signal $\Delta WD$ to change a distance between the objective lens 120 and the object. The second control signal $\Delta STIG$ may be a signal input to the astigmatism adjuster 123. Current, flowing to the stigmators of the astigmatism adjuster 123, may vary depending on the second control signal $\Delta STIG$. Accordingly, the astigmatism of the objective lens 120 may be adjusted.

The control unit 110 may obtain a plurality of kernel images, representing the distribution of the electron beam irradiated to the object through the aperture 125, from the plurality of original images obtained while adjusting the working distance. The control unit 110 may extract feature values from the plurality of kernel images, and may map the feature values to a desired (or, alternatively a predetermined) two-dimensional plane to determine a compensation direction for adjusting the astigmatism of the objective lens 120 and a working distance for obtaining an optimal pattern image from the object. The above operations may allow the first control signal ΔWD and the second control signal ΔSTIG to be determined.

The astigmatism adjuster 123 may adjust the astigmatism in a plurality of directions. As an example, the stigmators included in the astigmatism adjuster 123 may adjust he astigmatism in two or more directions, among directions parallel to a surface of the object.

FIGS. 3, 4A, 4B, 5A, and 5B are diagrams illustrating an operation of a semiconductor manufacturing device according to an example embodiment.

Figure 3:
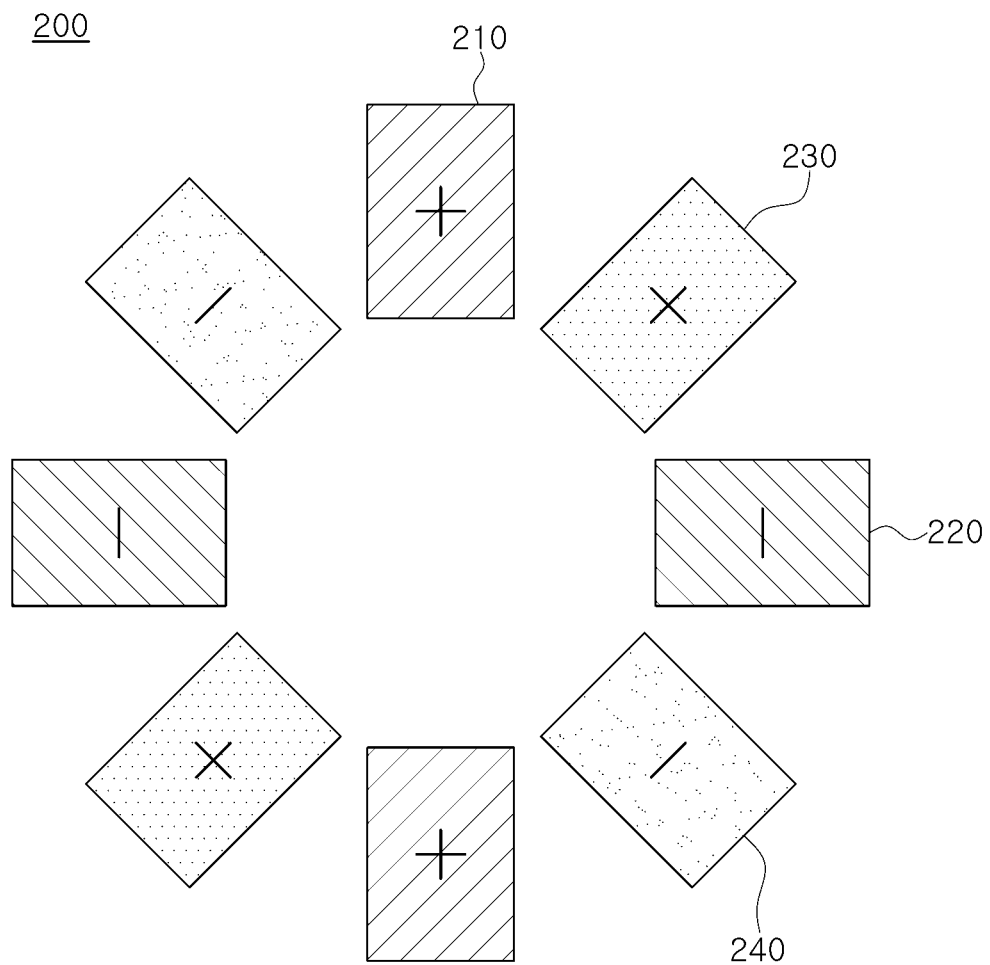
FIGS. 3, 4A, 4B, 5A, and 5B are diagrams illustrating an operation of a semiconductor manufacturing device according to an example embodiment.

FIG. 3 may be a schematic diagram illustrating an astigmatism adjuster 200 included in the semiconductor manufacturing device according to an example embodiment. Referring to FIG. 3, the astigmatism adjuster 200 may include a plurality of stigmators 210 to 240 which change an electromagnetic field to adjust astigmatism, and each of the plurality of stigmators 210 to 240 may include a pair of stigmators.

In the example embodiment illustrated in FIG. 3, a D1-D2 plane may be a plane, through which an electron beam passes, in a semiconductor manufacturing device using the electron beam. For example, the first stigmator 210 and the second stigmator 220 may adjust the electron beam in a direction D1 direction and a direction D2, and the third stigmator 230 and the fourth stigmator 240 may adjust the electron beam in diagonal directions intersecting the direction D1 and the direction D2.

Figure 4A:
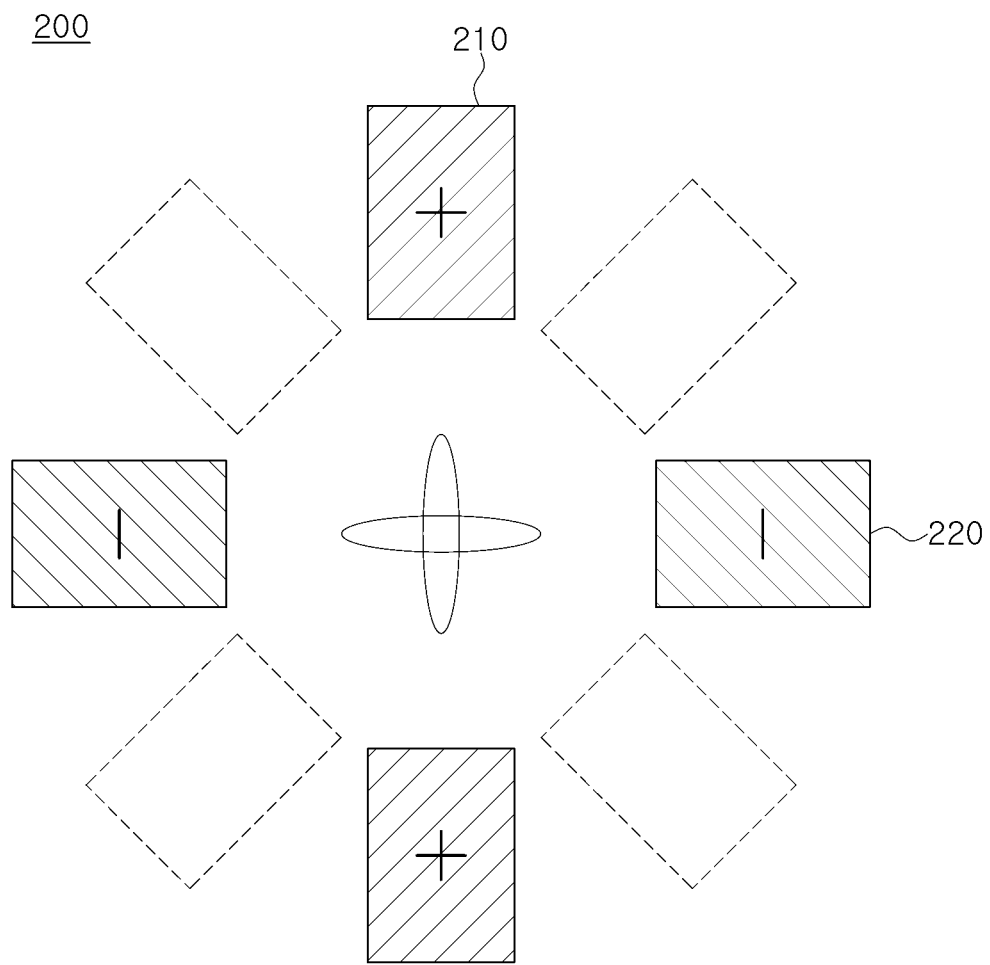
Figure 4B:
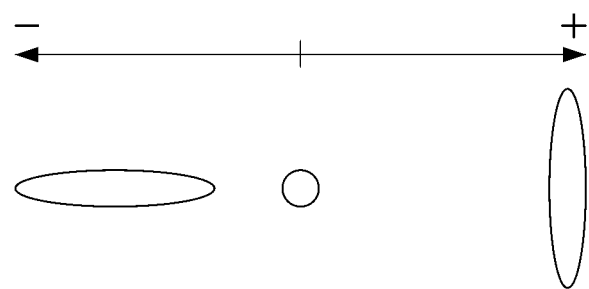

Referring to FIG. 4A, currents applied to the first stigmator 210 and the second stigmator 220 may be adjusted to adjust a distribution of an electron beam irradiated to a surface of an object in the direction D1 or the direction D2. As illustrated in FIG. 4B, when the first stigmator 210 and the second stigmator 220 adjust astigmatism in a positive (+) direction, the electron beam may be in the form of an ellipse having a major axis extending in the direction D2. Meanwhile, when the first stigmator 210 and the second stigmator 220 adjust astigmatism in a negative (−) direction, the electron beam may be in the form of an ellipse having a major axis extending in the direction D1.

Figure 5A:
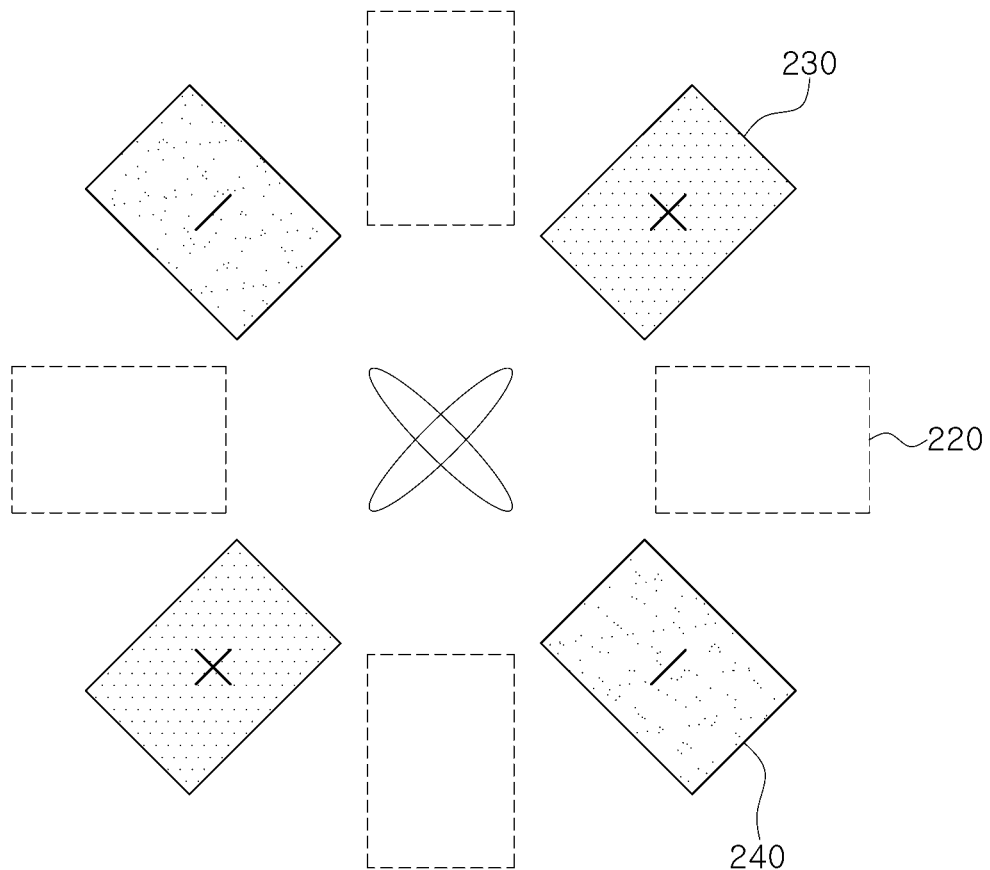
Figure 5B:
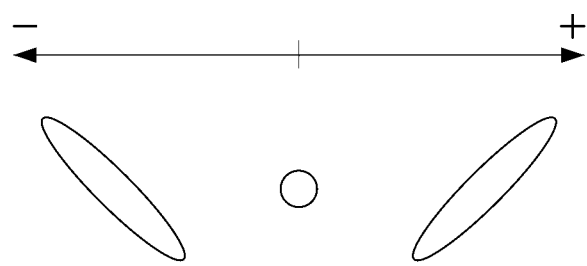

Referring to FIG. 5A, current applied to the third stigmator 230 and the fourth stigmator 240 may be adjusted to adjust a distribution of the electron beam irradiated to a surface of an object in a diagonal direction intersecting the direction D1 and the direction D2. As illustrated in FIG. 5B, when the third stigmator 230 and the fourth stigmator 240 adjust astigmatism in a positive direction, an electron beam may be in the form of an ellipse having a major axis extending in a first diagonal direction. The first diagonal direction may be a direction inclined to a direction D1 by 45 degrees in a counterclockwise direction. Meanwhile, when the third stigmator 230 and the fourth stigmator 240 adjust astigmatism in a negative direction, an electron beam may be in the form of an ellipse having a major axis extending in a second diagonal direction, perpendicular to the first diagonal direction.

Accordingly, the plurality of stigmators 210 to 240 may adjust astigmatism in various directions. As an example, when the first and second stigmators 210 and 220 adjust astigmatism in a positive direction and the third and fourth stigmators 230 and 240 adjust astigmatism in a negative direction, the electron beam may be in the form of an ellipse having a major axis extending in a direction between the second diagonal direction and the direction D2.

Figure 6:
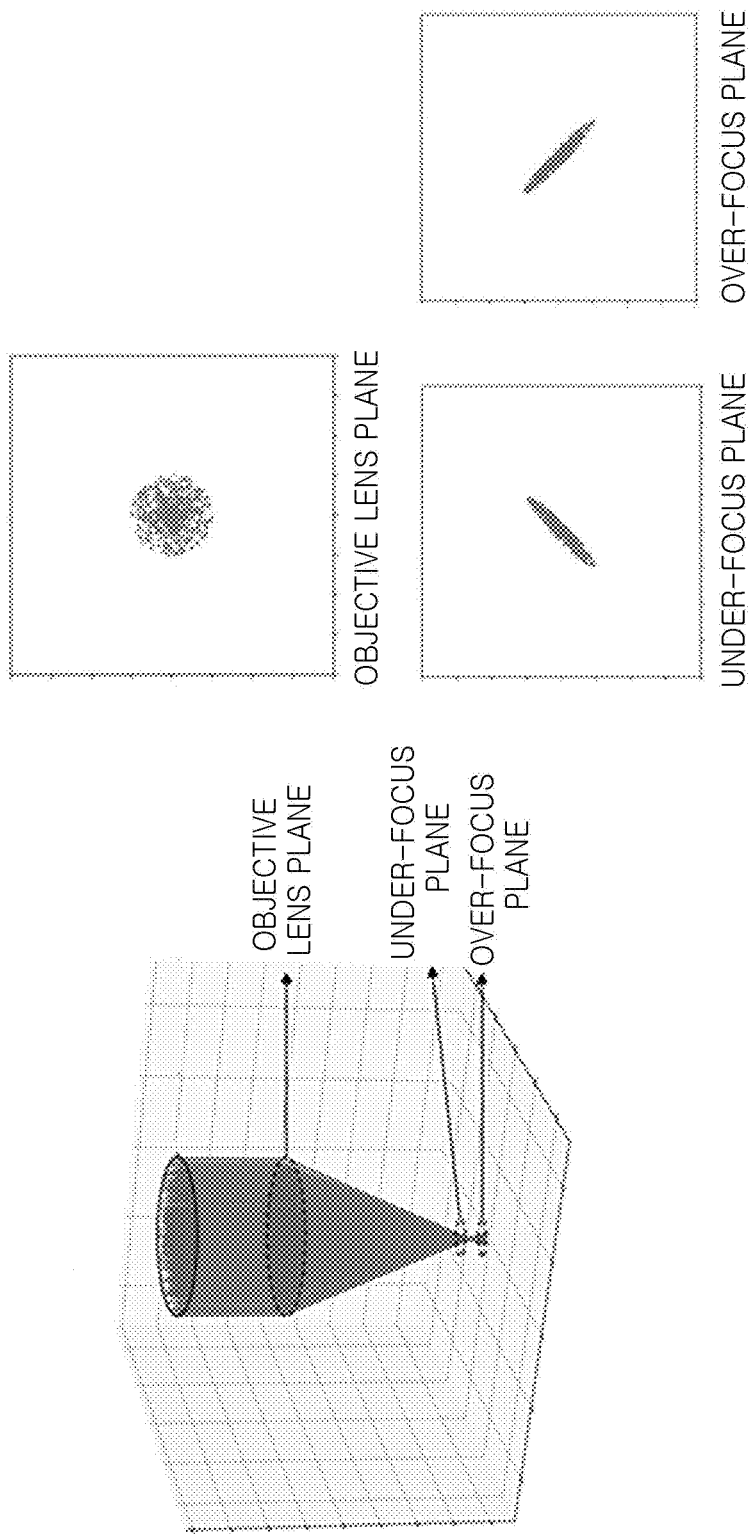
FIG. 6 is a diagram illustrating focus and astigmatism of a semiconductor manufacturing device according to an example embodiment.

FIG. 6 is a diagram illustrating focus and astigmatism of a semiconductor manufacturing device according to an example embodiment.

As an example, an electron beam irradiated from an electron beam source of the semiconductor manufacturing device may be focused on a single point of an object by scanning coils. As illustrated in FIG. 6, the electron beam irradiated by an electron beam source may have a circular shape in the plane of the objective lens. Accordingly, in a semiconductor process using an electron beam, when a target area of the object to be irradiated with the electron beam is disposed at a focal length of the objective lens, a distribution of the electron beam in the target area may also appear in a circular shape. For example, when a semiconductor manufacturing device using an electron beam is a scanning electron microscope (SEM) device, a target area in which structures to be measured by the SEM device are present is disposed at a focal length of an objective lens. In this case, in the target area, a distribution of an electron beam may have a circular shape and a pattern image, in which structure are accurately expressed without distortion, may be obtained.

Meanwhile, when the target area of the object does not match the focal length of the objective lens, an electron beam may be distributed along a shape having directionality, rather than a circular shape of the electron beam, as illustrated in FIG. 6. For example, in the case of an over-focused condition in which the target area of the object is disposed to be farther than the focal length of the objective lens, the electron beam distribution in the target area may have a shape extending in the first diagonal direction. Meanwhile, in the case of an under-focused condition in which the target area of the object is located closer than the focal length of the objective lens, a distribution of the electron beam in the target area may have a shape extending in the second diagonal direction. Therefore, in the case of the SEM device, a structure included in the target area may appear to be distorted by extending in the first diagonal direction under over-focused conditions and may appear to be distorted by extending in the second diagonal direction under under-focused conditions.

A working distance between the objective lens and the object may be adjusted to address the above issue, but noise such as blurring may be increased in an image in a state in which astigmatism occurs. Therefore, it may be difficult determine a working distance at which focus is accurately adjusted. Even when astigmatism is adjusted first, it may be difficult or impossible to remove the astigmatism unless a working distance during adjustment of the astigmatism is a working distance at which focus is accurately adjusted. As a result, the astigmatism and the working distance of the objective lens may be simultaneously adjusted to find operating conditions for obtaining distortion-free images. Accordingly, the present discloses proposes a method of automatically and simultaneously adjusting the working distance and the astigmatism of the objective lens.

As illustrated in FIG. 6, a directionality of an area, in which an electron beam is irradiated to a target area of the object under an over-focused condition, may be perpendicular to a directionality of an area in which an electron beam is irradiated to the target area of the object under an under-focused condition. Hereinafter, this is described in more detail with reference to FIGS. 7A, 7B, 8A, and 8B.

FIGS. 7A, 7B, 8A, and 8B are diagrams illustrating focus and astigmatism of a semiconductor manufacturing device according to an example embodiment.

Figure 7A:
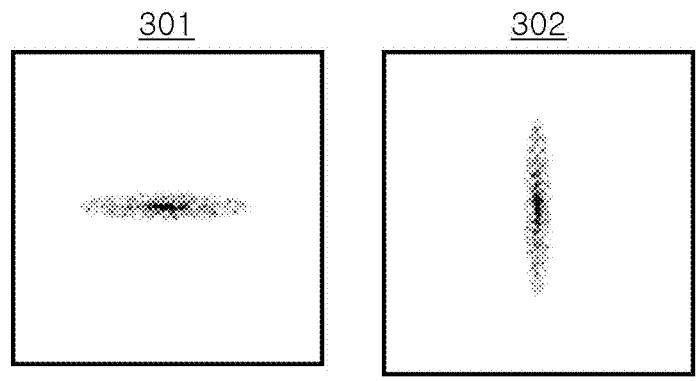
FIGS. 7A, 7B, 8A, and 8B are diagrams illustrating focus and astigmatism of a semiconductor manufacturing device according to an example embodiment.

In an example embodiment illustrated in FIG. 7A, a distribution of an electron beam irradiated to a target area of an object under an over-focused condition 301 may have a directionality corresponding to a direction D1. In this case, a distribution of an electron beam irradiated to the target area of the object under an under-focused condition 302 may have a directionality corresponding to a direction D2, perpendicular to the direction D1.

Figure 7B:
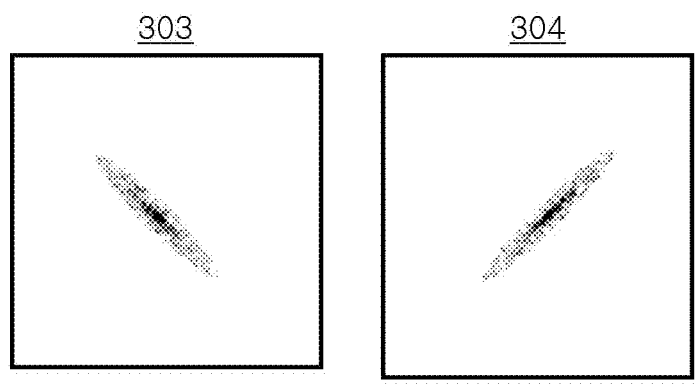

Referring to FIG. 7B, a distribution of an electron beam irradiated to the target area of the object under an over-focused condition 303 may have a directionality corresponding to a second diagonal direction toward an upper left portion. On the other hand, a distribution of an electron beam irradiated to the target area of the object under an under-focused condition 302 may have a directionality corresponding to a first diagonal direction, perpendicular to the second diagonal direction.

Figure 8A:
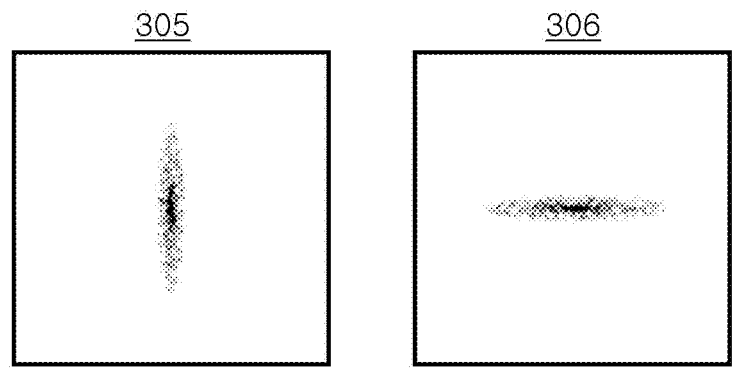

In an example embodiment illustrated in FIG. 8A, a distribution of an electron beam irradiated to the target area of the object under an over-focused condition 305 may have a directionality corresponding to a direction D2. In this case, a distribution of an electron beam irradiated to the target area of the object under an under-focused condition 306 may have a directionality corresponding to a direction D1, perpendicular to the direction D2.

Figure 8B:
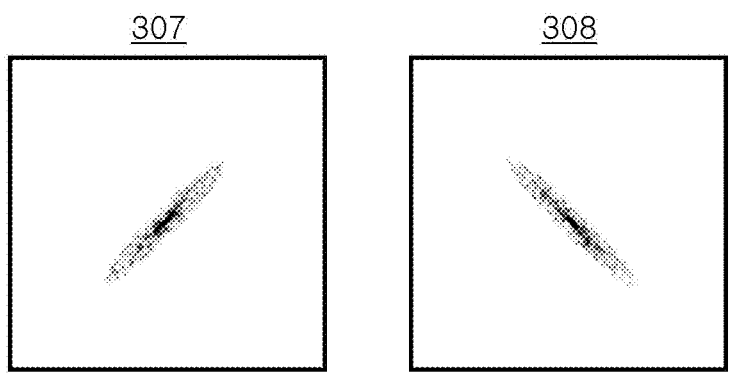

Referring to FIG. 8B, a distribution of an electron beam irradiated to the target area of the object in the over-focused condition 307 may have a directionality corresponding to a first diagonal direction toward an upper right portion. On the other hand, a distribution of an electron beam irradiated to the target area of the object may have a directionality corresponding to a second diagonal direction, perpendicular to the first diagonal direction.

As described above, a distribution of an electron beam irradiated to the target area of the object may be changed due to an effect of the working distance of the objective lens as well as the astigmatism. In an example embodiment, kernel images representing the distribution of the electron beam may be obtained from original images obtained by adjusting the working distance of the objective lens. Each of the kernel images may represent a distribution of an electron beam irradiated to the target area of the object under an over-focused condition or an under-focused condition according to the working distance of the objective lens capturing the original images. Accordingly, feature values representing a directionality of the electron beam may be extracted from the kernel images, and compensation data for adjusting astigmatism and a working distance for obtaining an optimal image may be obtained using the feature values. As a result, in an example embodiment, performance of a semiconductor manufacturing using an electron beam may be improved by automatically and simultaneously adjusting the working distance and astigmatism of the objective lens.

Figure 9:
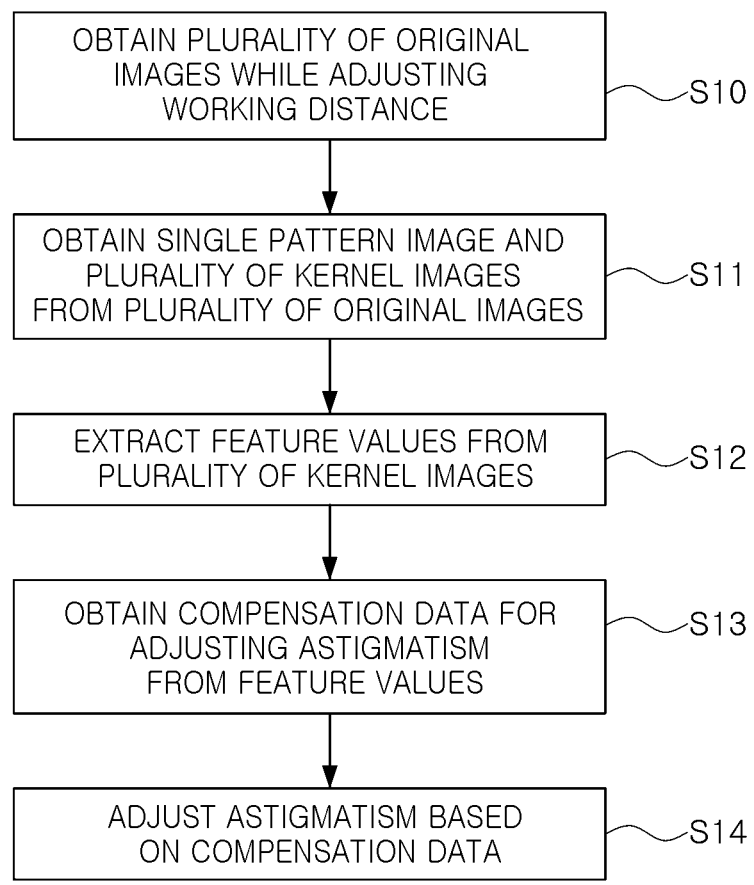
FIGS. 9 and 10 are flowcharts illustrating a method of controlling a semiconductor manufacturing device according to an example embodiment.
Figure 10:
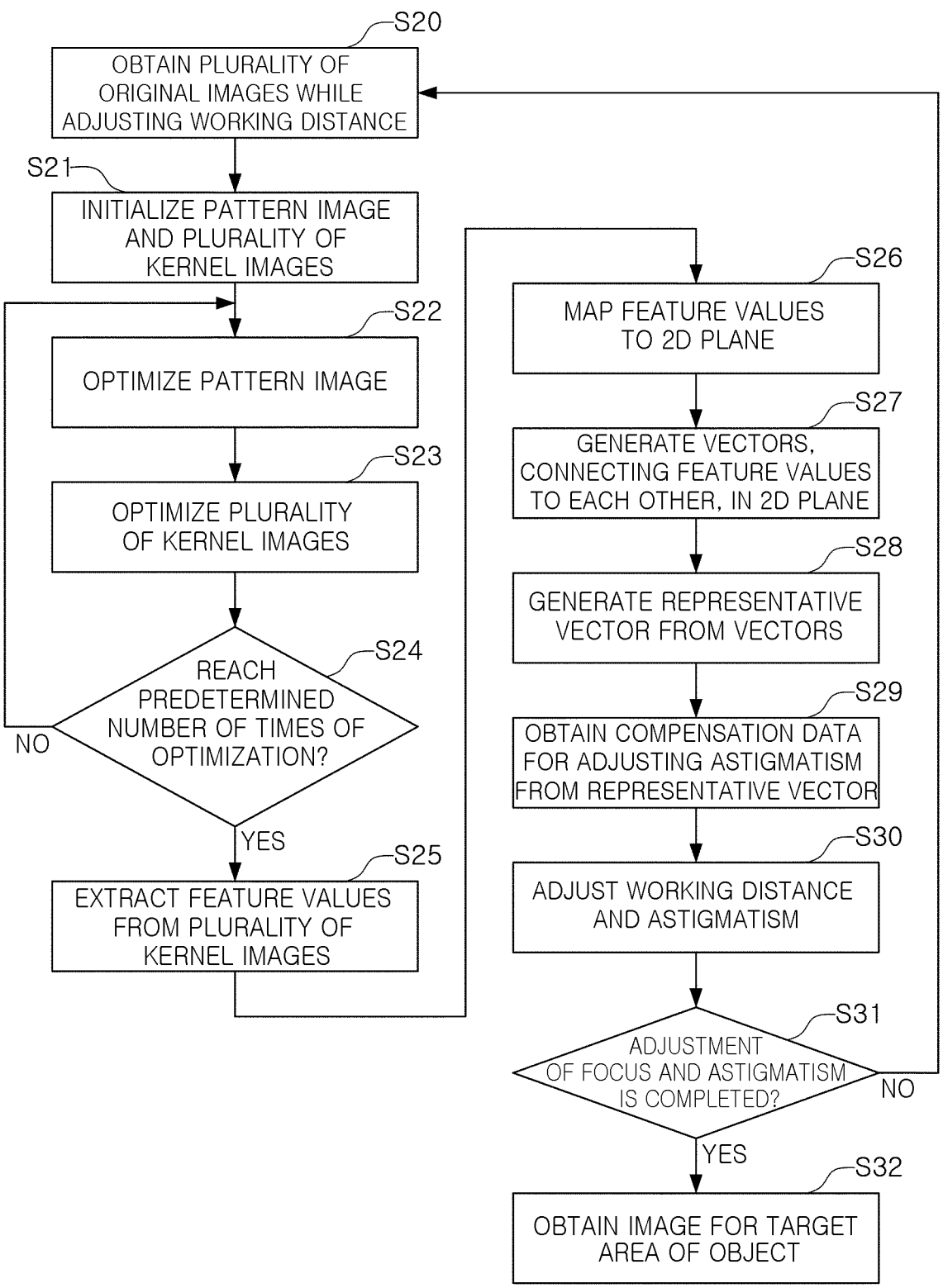

FIGS. 9 and 10 are flowcharts illustrating a method of controlling a semiconductor manufacturing device according to an example embodiment.

The method of controlling the semiconductor manufacturing device described with reference to FIGS. 9 and 10 may be applied to a device using an electron beam, such as a scanning electron microscope (SEM) device, and may be executed by a control unit of the semiconductor manufacturing device. Referring to FIG. 9, a method of controlling the semiconductor manufacturing device according to an example embodiment may start with operation S10 in which a control unit adjusts a working distance to obtain a plurality of original images. As described above, the working distance may be a distance between an objective lens and an object. When the working distance of the objective lens matches a focal length, the target area of the object may be accurate at the focus of the objective lens.

When the working distance of the objective lens is longer than the focal length, the electron beam may be irradiated to the target area of the object in an over-focused condition. In addition, when the working distance of the objective lens is shorter than the focal length, the electron beam may be irradiated to the target area of the object under an under-focused condition. Accordingly, the plurality of original images obtained in operation S10 while adjusting the working distance may include at least one original image obtained under the over-focused condition and at least one original image obtained under the under-focused condition.

In operation S11, when a plurality of original images are obtained, the control unit may obtain a single pattern image and a plurality of kernel images from the plurality of original images. The pattern image may be an image in which structures, present in a target region to which an electron beam is to be irradiated from an object, appear. The plurality of kernel images may be images illustrating a distribution of an electron beam irradiated to the object. As an example, a distribution of an electron beam, appearing in each of the plurality of kernel images, may vary, depending on a difference between a focal length and a working distance of the objective lens, astigmatism, and the like, as described above with reference to FIGS. 6 to 8B.

In operation S21, the control unit may extract feature values from the plurality of kernel images. The feature value may be a value representing directionality of the distribution of the electron beam appearing in each of the plurality of kernel images. As an example, the feature value may include data on a direction in which the distribution of the electron beam is directed and how widely the electron beam is spread and distributed in a corresponding direction.

In operation S13, the control unit may obtain compensation data for adjusting astigmatism from the feature values. As an example, an electron beam distributions in the plurality of kernel images may be different from each other, and thus, pieces of data included in the feature values may also be different from each other. In operation S14, the control unit may obtain compensation data having robust characteristics, which are not significantly outside of an overall tendency of the feature values, using the feature values, and may adjust the astigmatism based on the compensation data. The control unit may adjust the astigmatism and may simultaneously determine an optimal working distance of the objective lens.

Referring to FIG. 10, a method of controlling a semiconductor manufacturing device according to an example embodiment may start with operation S20 in which a control unit adjusts a working distance and acquiring a plurality of original images. When the plurality of original images are obtained, the control unit of the semiconductor manufacturing device may perform an operation to obtain a single pattern image and a plurality of kernel images from the plurality of original images.

As an example, each of the plurality of original images may correspond to convolution of a pattern image, in which structures present in an object appear, and a plurality of kernel images, respectively corresponding to shapes of an electron beams irradiated to the object according to the working distance. Accordingly, the control unit may apply a deconvolution operation to the plurality of original images to obtain a first equation, corresponding to a pattern image, and a second equation corresponding to a distribution of an electron beam shapes appearing in each of the plurality of kernel images.

In operation S21, the control unit may initialize the pattern image and the plurality of kernel images to obtain the pattern image and the plurality of kernel images. For example, the control unit may set an initial value of the pattern image and an initial value of each of the plurality of kernel images. As an example, the control unit may select an initial value of the pattern image as a random noise image, and may select an initial value of each of the plurality of kernel images as a point spread function (PSF) having a Gaussian distribution having no directionality.

In operations S22 and 23, when the initial value of the pattern image and the initial value of each of the plurality of kernel images are determined, the control unit may apply a gradient descent method to each of the first and second equations to optimize or improve the pattern image and the plurality of kernel images. Referring to FIG. 10, the control unit may alternately optimize or improve the pattern image and the plurality of kernel images. Unlike the example embodiment illustrated in FIG. 10, the plurality of kernel images may be optimized or improved ahead of the pattern image. The control unit may repeatedly perform an optimization or improvement operation on the pattern image and the plurality of kernel images, and may repeatedly execute the optimization or improvement operation by a desired (or, alternatively a predetermined) number of times of optimizations in operation S24. The control unit may include a graphics processing unit (GPU) and a central processing unit (CPU). The control unit may perform an optimization or improvement operation on the GPU specific to image processing, rather than the CPU, to reduce time required for the optimization or improvement operation.

In operation S25, when the pattern image and the plurality of kernel images are optimized or improved by the number of times of optimization or improvement, the control unit may extract feature values, representing the distribution of the electron beam, from each of the plurality of kernel images. The feature values extracted from each of the plurality of kernel images may represent a length and an angle of inclination of an electron beam distribution appearing in each of the plurality of kernel images. In operation S26, the control unit may map the feature values, extracted in operation S24, to an additionally defined two-dimensional (2D) plane.

The control unit may generate vectors connecting the feature values, mapped to the 2D plane, to each other in operation S27, and may generate a representative vector from the vectors in operation S28. As an example, the control unit may normalize the plurality of generated vectors, and may determine a direction of a median vector of the normalized vectors as a direction of the representative vector. Also, the control unit may determine a variance of the feature values, for example, a standard deviation, as a length of the representative vector.

The control unit may obtain compensation data for adjusting astigmatism from the representative vector, generated in operation S28, in operation S29 and may adjust the astigmatism based on the compensation data in operation S30. As an example, the control unit may compensate for astigmatism according to the direction of the representative vector, and may compensate for the astigmatism by a length of the representative vector.

In operation S30, the control unit may adjust a working distance of the objective lens together with the astigmatism. As an example, the control unit finds a feature value, closest to an origin of the 2D plane, among the feature values mapped to the 2D plane, and may sets the working distance of the objective lens as a working distance corresponding to the original image corresponding to the found feature value.

In operation S31, when the adjustment of the working distance and astigmatism is completed, the control unit may determine whether adjustment of focus and astigmatism is completed. As an example, the control unit may determine whether the adjustment of focus and astigmatism is completed, using the distribution of feature values mapped to the 2D plane in operation S26. In an example embodiment, when the feature values are distributed within a desired (or, alternatively a predetermined) range of the 2D plane, the control unit may determine that optimization or improvement has been complete.

When a result of the determination in operation S31 is that the adjustment of focus and astigmatism has not been completed, the control unit may readjust the working distance of the objective lens to obtain new original images in operation S20. While the control unit obtains the new original images, the working distance of the objective lens is changed based on the working distance set in operation S30, and the astigmatism of the objective lens may have the astigmatism adjusted in operation S30. Accordingly, the new original images obtained by the control unit may be different from the plurality of original images described above.

The control unit may re-perform operations S21 to S30 using the new original images to determine compensation data for adjusting astigmatism and a new working distance of the objective lens. In operation S31, the control unit may re-determine whether the adjustment of focus and astigmatism has been completed, based on the distribution of feature values mapped to the 2D plane. As a result of the determination, even when it is not determined that the optimization or improvement has been completed, the control unit may adjust the working distance and the astigmatism of the objective lens, based on new extracted feature values, and may then re-perform operations S20 to S30.

In operation S32, when the determination in operation S31 is that the adjustment of focus and astigmatism has been completed, the control unit may obtain an image of the target area of the object. Since the control unit may perform operations S20 to S30 at least once to adjust the working distance of the objective lens fitted for the focal length and to compensate for the astigmatism of the objective lens as much as possible, clear and accurate images may be obtained.

As described above, in an example embodiment, when only the initial value of the working distance of the objective lens is determined, the semiconductor manufacturing device may automatically adjust the astigmatism of the objective lens and may simultaneously operate the objective lens corresponding to the optimal focus distance. Accordingly, the semiconductor manufacturing device using an electron beam may reduce the time required to control astigmatism and to optimize or improve a focal length to improve efficiency of various processes using the semiconductor manufacturing device.

Figure 11A:
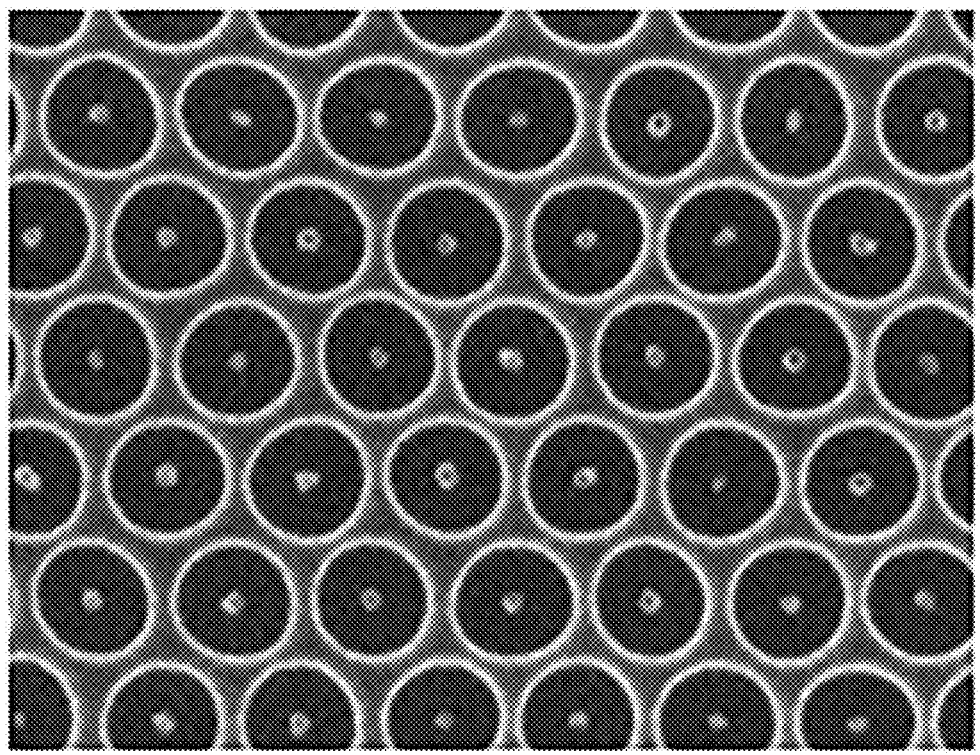
FIGS. 11A and 11B are diagrams illustrating images obtained by a scanning electron microscope (SEM) device according to an example embodiment.
Figure 11B:
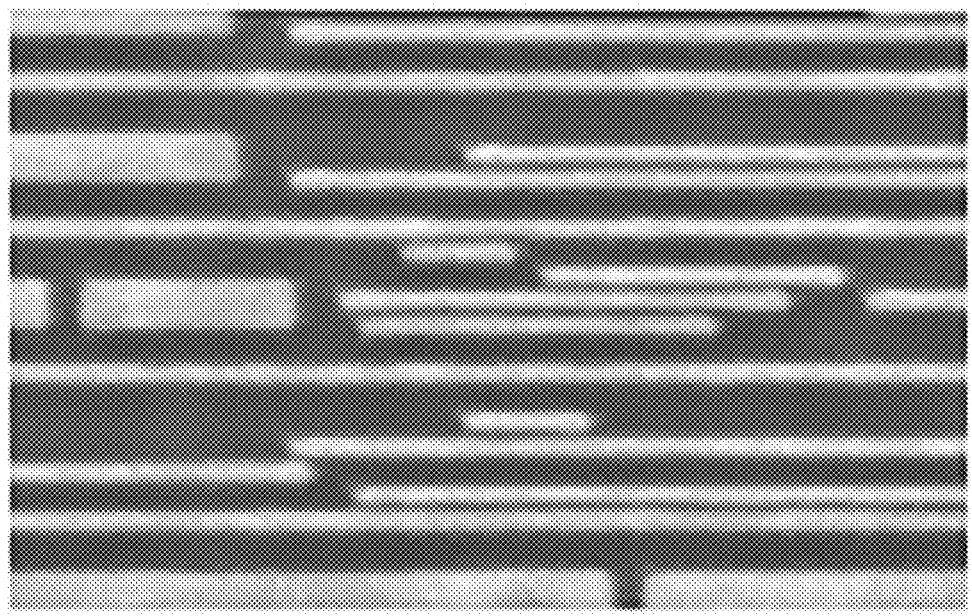

FIGS. 11A and 11B are diagrams illustrating images obtained by a scanning electron microscope (SEM) device according to an example embodiment.

In an example embodiment illustrated in FIG. 11A, structures having a weak directionality may be included in an image obtained by an SEM device. As an example, referring to FIG. 11A, when structures having a weak directionality and repeatedly appearing, such as channel structures included in a vertical memory device, are captured by the SEM device, astigmatism and focus of the SEM device may be relatively easily adjusted.

On the other hand, in an example embodiment illustrated in FIG. 11B, structures having a clear direction and not appearing repeatedly, such as interconnection patterns included in a semiconductor device, may be captured by an SEM device. In this case, as compared with the example embodiment illustrated in FIG. 11A, a relatively large amount of time may be required to adjust astigmatism and focus of the SEM device.

As described above, according to an example embodiment, a plurality of kernel images representing a distribution of an electron beam caused by astigmatism may be extracted by applying a deconvolution operation to a plurality of original images obtained while changing a working distance in an SEM device. Accordingly, as illustrated in FIG. 11B, even when structures having clear directionality are desired to be imaged, a plurality of kernel images in which distribution distortion of an electron beam caused by astigmatism is reflected may be obtained. In addition, since compensation data for adjusting astigmatism may be obtained based on feature values extracted from a plurality of kernel images, the astigmatism adjustment and focus adjustment may be automatically and rapidly performed irrespective of a directionality and a shape of structures included in the object.

Figure 12A:
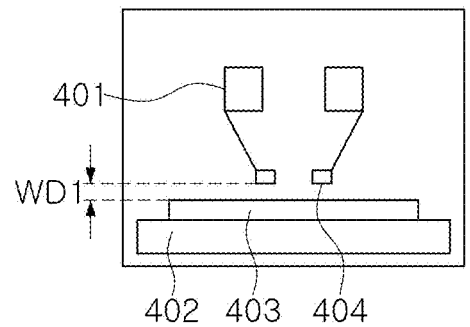
FIG. 12A to 12C are diagrams illustrating a method of controlling a semiconductor manufacturing device according to an example embodiment.
Figure 12A:
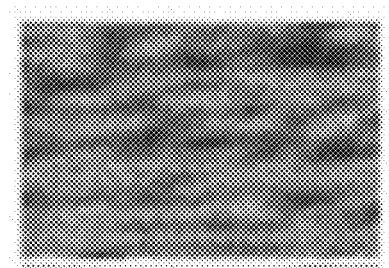
Figure 12B:
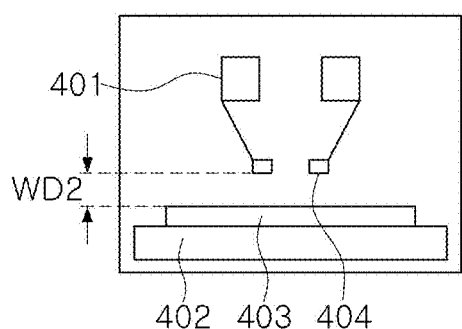
Figure 12B:
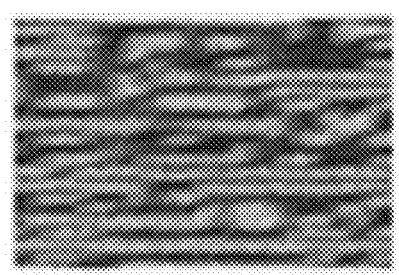
Figure 12C:
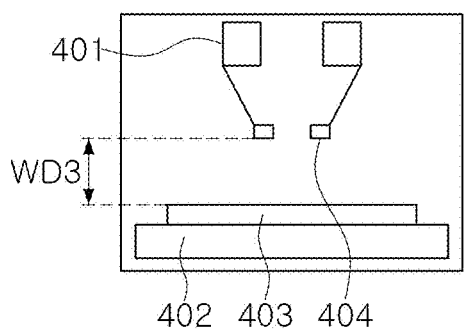
Figure 12C:
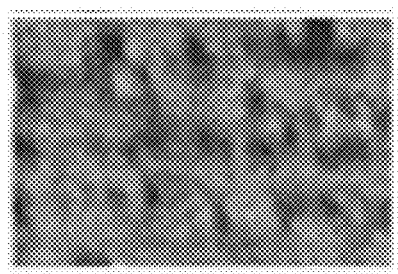

FIG. 12A to 12C are diagrams illustrating a method of controlling a semiconductor manufacturing device according to an example embodiment.

FIGS. 12A to 12C may be diagrams illustrating a method of obtaining a plurality of original images while changing a working distance of an objective lens 401 in a semiconductor manufacturing device 400 using an electron beam. Referring to FIGS. 12A to 12C, an object 403 may be seated on a stage 402, and a control unit of an SEM device 400 may set a working distance of an objective lens 401 to first to third working distances WD1 to WD3 to obtain a plurality of original images 405 to 407. The working distance may be a distance between the objective lens 401 and the object 403 as described above. An electron beam collection0 unit 404 may be provided on one side of the objective lens 401 close to the object 403.

Referring to FIG. 12A, the control unit may obtain a first original image 405 in a state in which the objective lens 401 is disposed at the first working distance WD1. For example, the first working distance WD1 may be shorter than a focal length of the objective lens 401, and the first original image 405 may be an image captured under an under-focused condition.

Referring to FIG. 12B, the control unit may obtain a second original image 406 in a state in which the objective lens 401 is disposed at the second working distance WD2. The second working distance WD2 may substantially match the focal length of the objective lens 401, and thus, structures included in an object may be displayed to be relatively clear in the second original image 406.

Referring to FIG. 12C, the control unit may obtain a third original image 407 in a state in which the objective lens 401 is disposed at the third working distance WD3. For example, the third working distance WD3 may be longer than the focal length of the objective lens 401, and the third original image 407 may be an image captured under an over-focused condition.

As described with reference to FIGS. 12A to 12C, the control unit of the semiconductor manufacturing device 400 may obtain a plurality of original images 405 to 407 while changing the working distance of the objective lens. Since the electron beam is irradiated to a target area of the same object under various conditions such as over-focused and under-focused conditions according to the working distance of the objective lens, the target area of the object may be expressed to be different in the plurality of original images 405 to 407. Hereinafter, this is described in detail with reference to FIG. 13.

Figure 13:
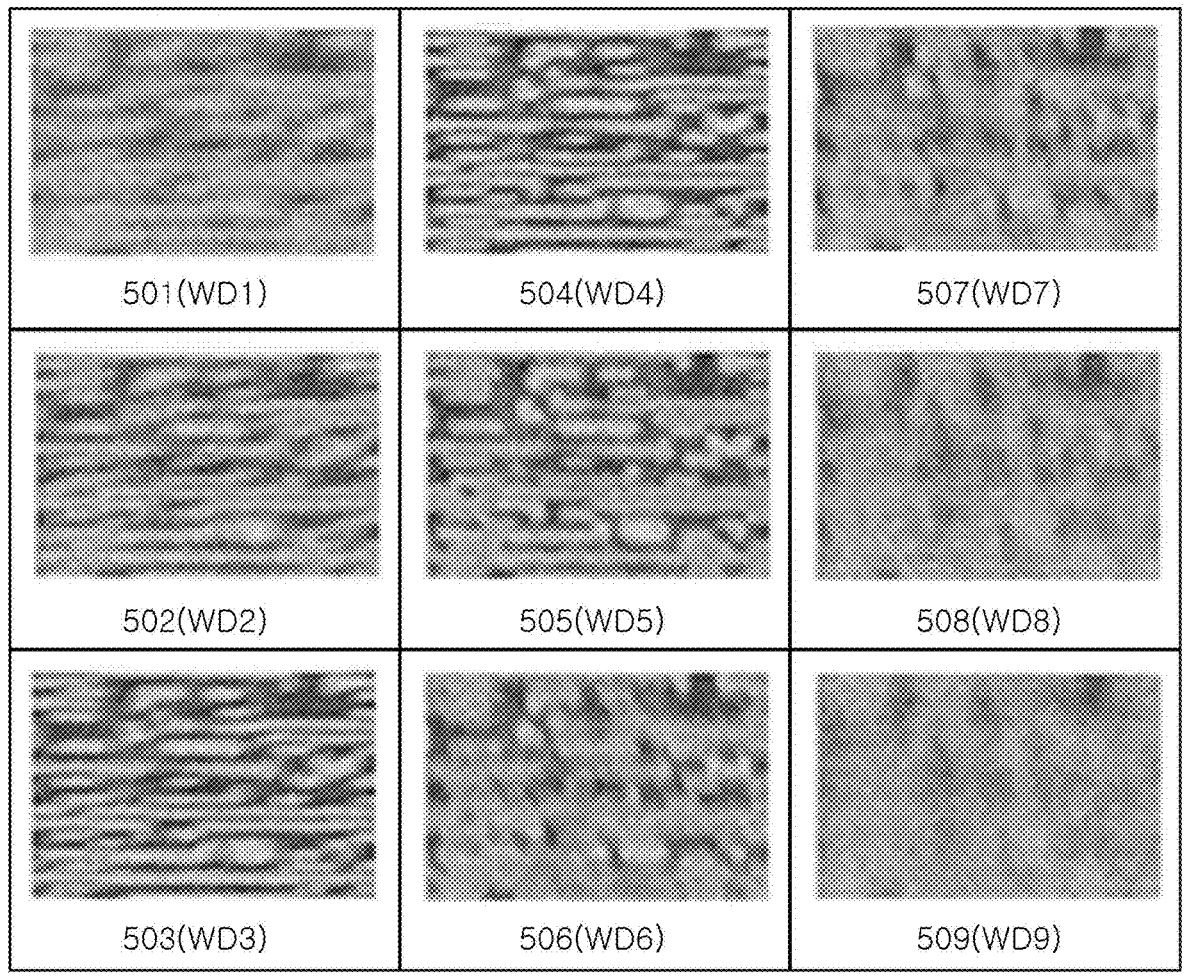
FIG. 13 includes diagrams illustrating a method of controlling a semiconductor manufacturing device according to an example embodiment.
Figure 14A:
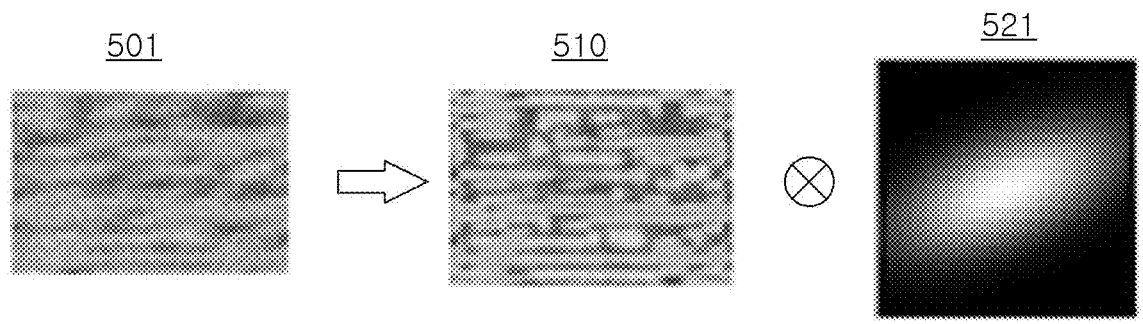
FIGS. 14A to 14I are diagrams illustrating a method of controlling a semiconductor manufacturing device according to an example embodiment.
Figure 14B:
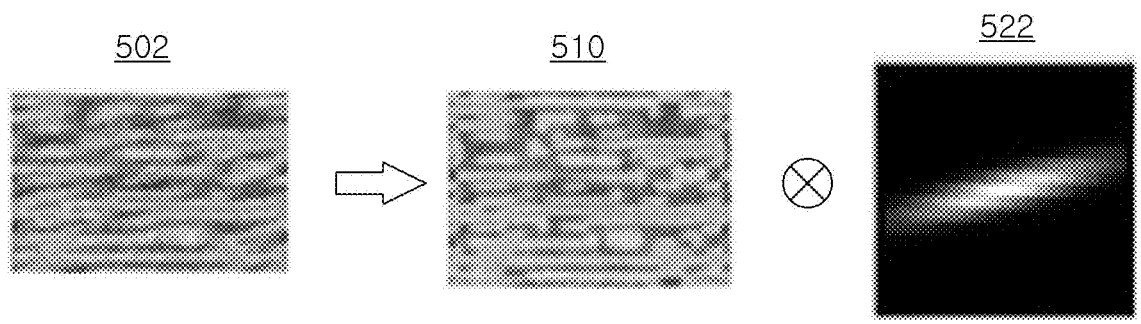
Figure 14C:
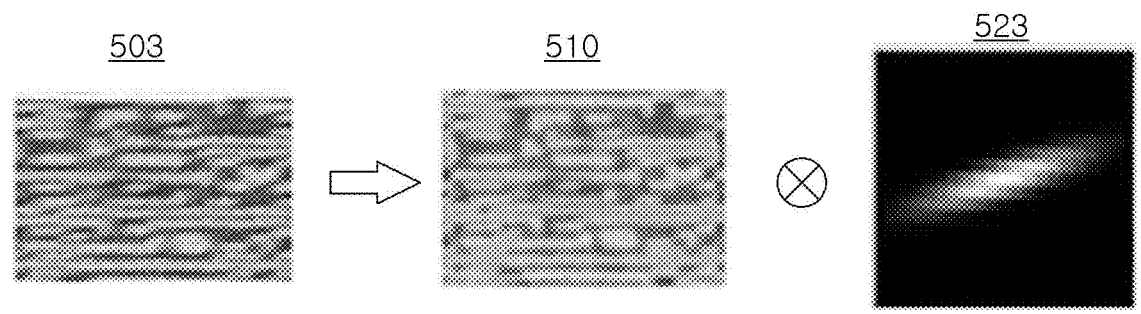
Figure 14D:
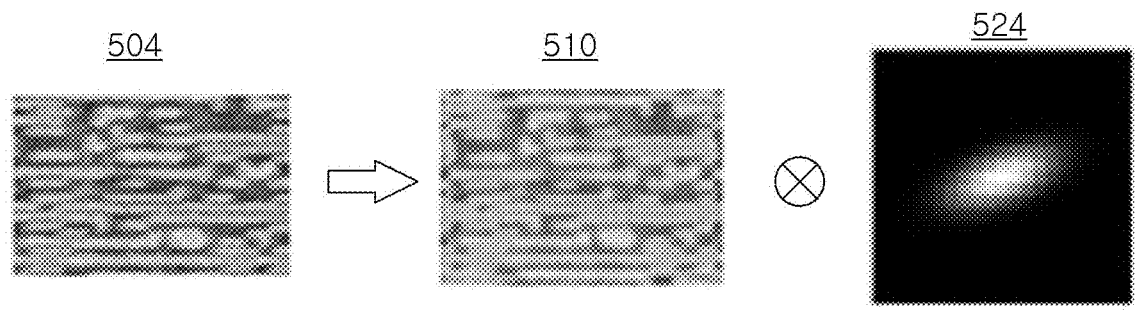
Figure 14E:
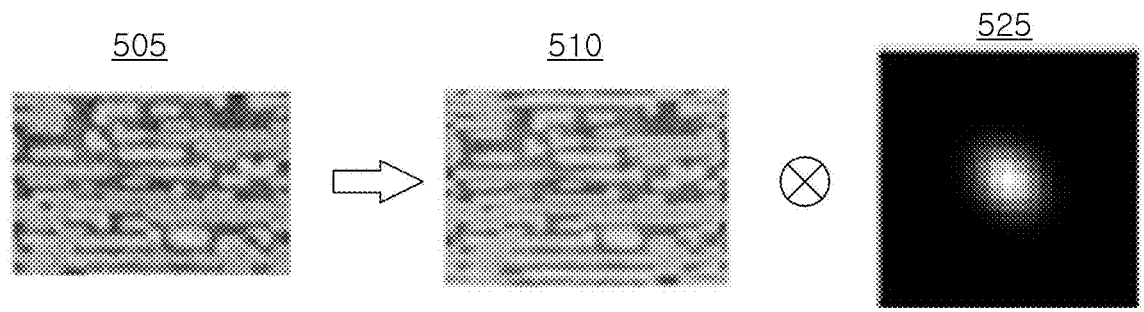
Figure 14F:
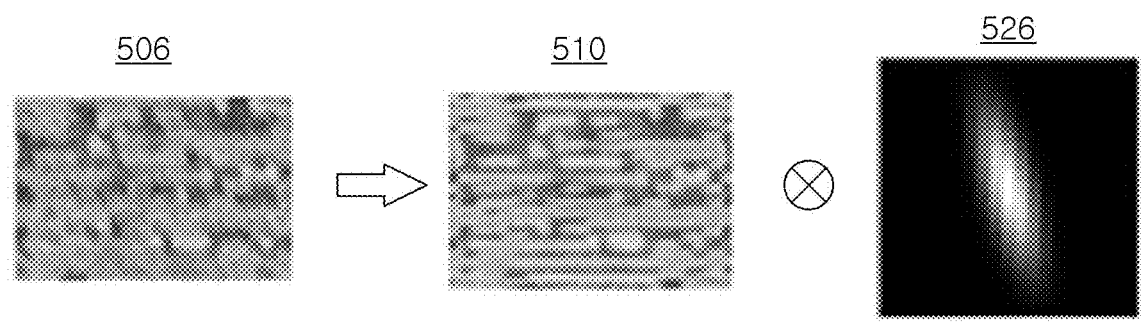
Figure 14G:
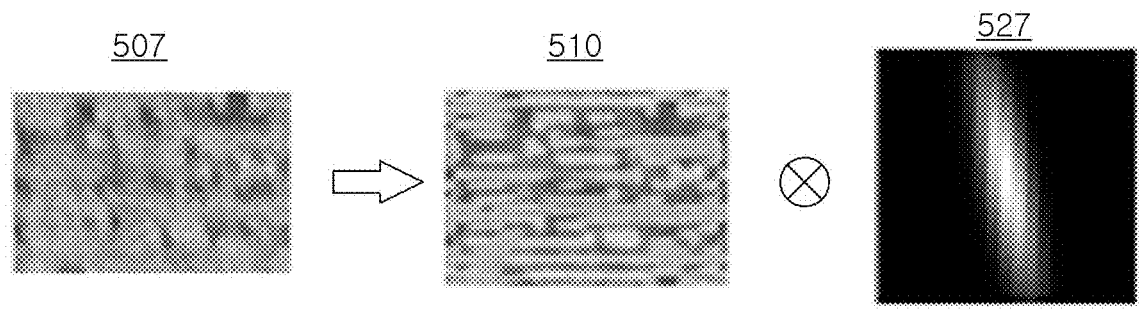
Figure 14H:
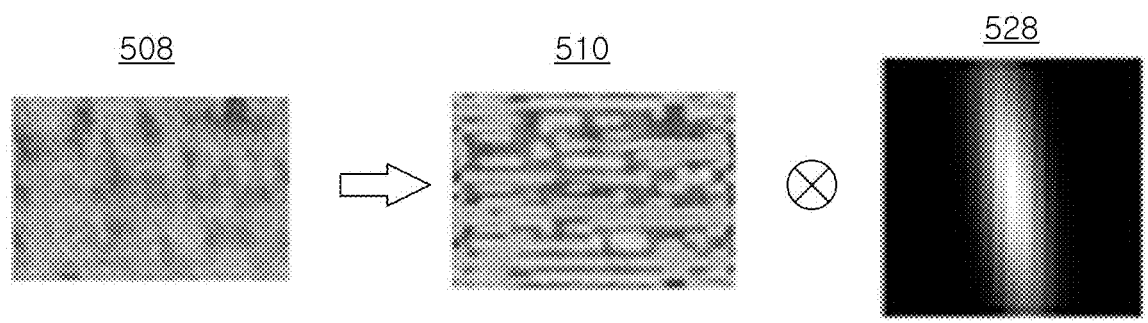
Figure 14I:
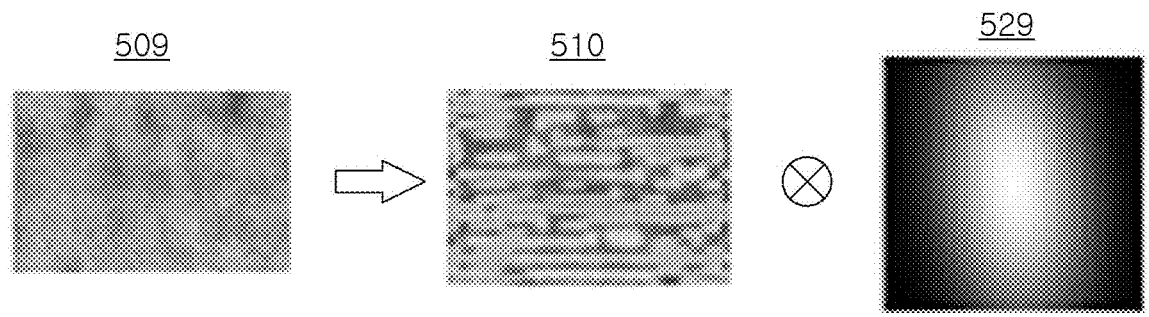

FIG. 13 includes diagrams illustrating a method of controlling a semiconductor manufacturing device according to an example embodiment.

FIG. 13 is a diagram illustrating a plurality of original images 501 to 509 obtained by irradiating an electron beam to a target area of an object at various working distances WD1 to WD9 in a semiconductor manufacturing device using an electron beam. Referring to FIG. 13, a working distance closest to a focal length of an objective lens may be the third working distance WD3 or the fourth working distance WD4. Accordingly, structures included in the target area of the object may be displayed to be clearest in the third original image 503 or the fourth original image 504.

In each of the first original image 501 and the seventh to ninth original images 507 to 509, structures included in a target area of an object may hardly be displayed. However, since the plurality of original images 501 to 509 are obtained by irradiating an electron beam to the same structures, they may be obtained through a convolution operation of a pattern image, in which structures are displayed, and a plurality of kernel images. For example, the first to ninth original images 501 to 509 may be obtained by applying each of the first to ninth kernel images, different from each other, to a single pattern image.

Accordingly, reversely, a single pattern image and a plurality of kernel images may be obtained by applying a deconvolution operation to each of the plurality of original images 501 to 509. The pattern image may be an image in which structures formed in the target area of the object are displayed, and the plurality of kernel images may be images representing a distribution of an electron beam irradiated to the target area of the object. For example, the distribution of the electron beam in each of the plurality of kernel images may be expressed in the form of a point spread function. Hereinafter, this is described in more detail with reference to FIGS. 14A to 14I.

FIGS. 14A to 14I are diagrams illustrating a method of controlling a semiconductor manufacturing device according to an example embodiment.

Referring to FIGS. 14A to 14I, a plurality of original images 501 to 509 may be obtained by irradiating an electron beam to a target area of an object while changing only a working distance of an objective lens under the same conditions. As described above, a single pattern image 510 and a plurality of kernel images 521 to 529 may be extracted by applying a deconvolution operation to the plurality of original images 501 to 509.

Both the pattern image 510, in which structures included in the target area of the object are displayed, and the plurality of kernel images 521 to 529, in which the electron beam irradiated to the target area of the object are represented as a point spread function, have unknown values. Therefore, it is necessary to estimate each of the pattern image 510 and the plurality of kernel images 521 to 529. In an example embodiment, the pattern image 510 and the plurality of kernel images 521 to 529 may be each be estimated under the assumptions that structures displayed on the pattern image 510 have sharp characteristics, a point spread function representing a distribution of an electron beam in the plurality of kernel images 521 to 529 has a Gaussian distribution, and a focal length of an objective lens is present within a range of working distance used to capture the plurality of original images 501 to 509.

An optimization or improvement equation of deconvolution for extracting each of the pattern image 510 and the plurality of kernel images 521 to 529 may be represented by the following Equation 1.

$$F = \min_{u,\Sigma_0,\ldots,\Sigma_n} \frac{1}{n}\sum_{k=0}^{n} \|k_{\Sigma_i} \circ u - f_i\|_2^2 + \lambda\|\nabla u\|_1^1 \quad \text{[Equation 1]}$$

In Equation 1, k may correspond to a point spread function having a Gaussian distribution, for example, the plurality of kernel images 521 to 529, and u may correspond to the pattern image 510. In addition, f may correspond to the plurality of original images 501 to 509, and λ may be a balancing parameter. Equation 1 may be divided into Equation 2 for obtaining the pattern image 510 and Equation 3 for obtaining the plurality of kernel images 521 to 529. The control unit of the semiconductor manufacturing device may alternately optimize or improve Equation 2 and Equation 3. As an example, the control unit may optimize or improve Equation 2 and Equation 3 by applying a gradient descent method a desired (or, alternatively a predetermined) number of times.

$$F_u = \min_{u} \frac{1}{n}\sum_{k=0}^{n} \|k_{\Sigma_i} \circ u - f_i\|_2^2 + \lambda\|\nabla u\|_1^1 \quad \text{[Equation 2]}$$

$$F_{\Sigma_i} = \min_{\Sigma_i} \frac{1}{n}\|k_{\Sigma_i} \circ u - f_i\|_2^2 \quad \text{[Equation 3]}$$

An initial value of the pattern image 510 and an initial value of each of the plurality of kernel images 521 to 529 need to be selected such that Equation 2 and Equation 3 are optimized or improved by applying a gradient descent method thereto. In an example embodiment, the control unit of the semiconductor manufacturing device may set the initial value of the pattern image 510 as a random noise image and may set the initial value of the point spread function, included in each of the plurality of kernel images 521 to 529, as a Gaussian distribution function having no directionality. A method of applying a gradient descent method to each of the pattern image 510 and the plurality of kernel images 521 to 529 to be optimized or improved may be defined as in the following Equations 4 and 5.

$$u \leftarrow u - \epsilon_u \frac{\partial F_u}{\partial u} \quad \text{[Equation 4]}$$

$$\sum_i \leftarrow \sum_i - \epsilon_\Sigma \frac{\partial F_{\Sigma_i}}{\partial \sum_i} \quad \text{[Equation 5]}$$

To sum up, the pattern image 510 may be optimized or improved by repeatedly subtracting a value, obtained by differentiating Equation 2 with u corresponding to the pattern image 510, with start from a random noise image, an initial value. A point spread function, represented by each of the plurality of kernel images 521 to 529, may be optimized or improved by repeatedly subtracting a value, differentiating Equation 3 with Σi corresponding to a covariance of the plurality of kernel images 521 to 529, with start from a Gaussian distribution function having no directionality, an initial value. The operation described with reference to Equations 4 and 5 may be repeatedly performed to extract the pattern image 510 and the plurality of kernel images 521 to 529, as illustrated in FIGS. 14A to 14I.

Since the plurality of kernel images 521 to 529 represent a distribution of an electron beam as a point spread function, point spread functions rotated by 90 degrees may appear in at least some of the plurality of kernel images 521 to 529. As an example, in the example embodiments illustrated in FIGS. 14A to 14I, a fourth point spread function illustrated in the fourth kernel image 524 may have a shape rotated by 90 degrees with respect to a sixth point spread function illustrated in the sixth kernel image 526. This may be because the distribution of the electron beam irradiated to the object is rotated by 90 degrees under each of the over-focused condition and the under-focused condition, as described above with reference to FIGS. 7A to 8B.

Figure 15:
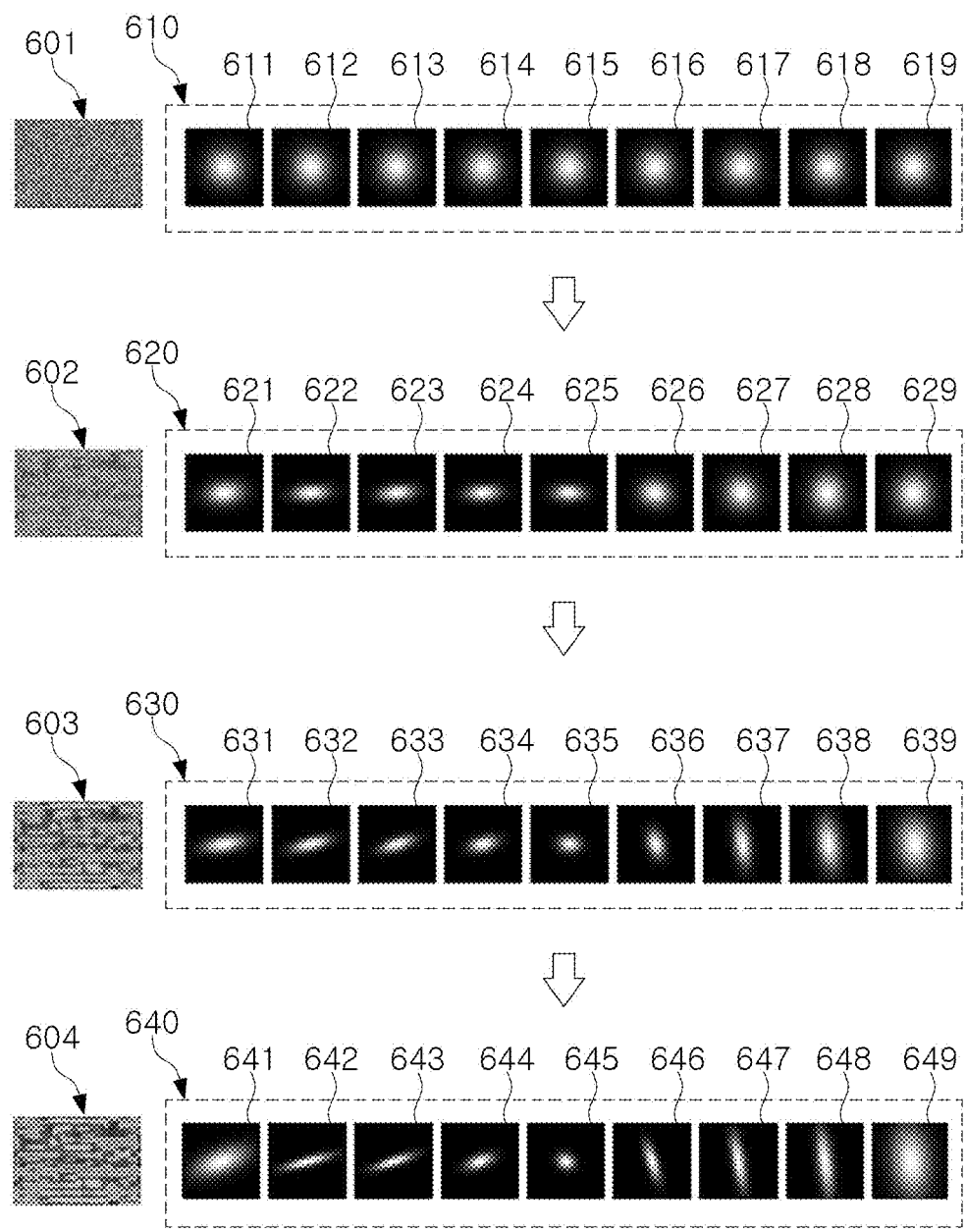
FIG. 15 includes diagrams illustrating a method of controlling a semiconductor manufacturing device according to an example embodiment.

FIG. 15 includes diagrams illustrating a method of controlling a semiconductor manufacturing device according to an example embodiment.

FIG. 15 is a diagram illustrating a process of repeatedly performing the operation, described with reference to FIS. 14A to 14I, to optimize or improve a pattern image and a plurality of kernel images from a plurality of original images. As described above, the pattern image 601 and the plurality of kernel images 611 to 619 (collectively "610") may be initialized before the operation.

Referring to FIG. 15, a pattern image 601 may be initialized as a random noise image, and thus, a structure having a specific pattern may not appear in the initialized pattern image 601. A point spread function, representing a distribution of an electron beam in a plurality of kernel images 611 to 619, may be initialized as a Gaussian distribution function having no directionality. Accordingly, a distribution of an electron beam in each of the initialized kernel images 611 to 619 may appear in the form of the same point spread function, as illustrated in FIG. 15.

Referring to FIG. 15, as the optimization or improvement is repeatedly performed, pattern images 602 to 604 may be updated. Finally, a pattern image 604 in which structures included in a target area of an object are displayed may be obtained. In addition, as the optimization or improvement is repeatedly performed, point spread functions representing the distribution of an electron beam in the plurality of kernel images 620 to 640 may be expressed as Gaussian distribution functions having different directionalities and distributions.

For example, referring to a plurality of kernel images 621 to 629 (collectively "620") obtained after repeatedly performing the optimization or improvement by the first number of times, a point spread function may be expressed as a distribution function having a directionality in at least some of the kernel images 621 to 629, unlike the initialized kernel images 611 to 619. In a plurality of kernel images 631 to 639 (collectively "630") in which optimization or improvement is repeatedly performed by the second number of times, greater than the first number of times, a difference in point spread function may be clearer. In a plurality of kernel images 641 to 649 (collectively "640") in which optimization or improvement is repeatedly performed by the third number of times, greater than the second number of times, a difference in point spread function may be further increased. As an example, after the optimization or improvement is repeatedly performed by the third number of times, a point spread function representing a distribution of an electron beam in the first kernel image 641 may have directionality and distribution, significantly different from those of a point spread function representing a distribution of an electron beam in the ninth kernel image 649.

As illustrated in FIG. 15, when the optimization or improvement is repeatedly performed and the number of times thereof reaches a desired (or, alternatively a predetermined) number, the control unit of the semiconductor manufacturing device may extract a feature value from each of the plurality of kernel images 641 to 649 and may determine whether the optimization or improvement has been completed, from the feature value. Hereinafter, a method of extracting feature values from the plurality of kernel images 641 to 649 and a method of determining whether optimization or improvement has been complete is described in more detail with reference to FIGS. 16 to 18.

Figure 16:
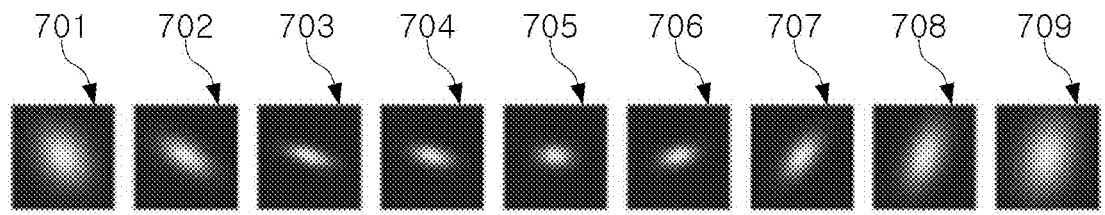
FIGS. 16 to 18 are diagrams illustrating a method of controlling a semiconductor manufacturing device according to an example embodiment.
Figure 16:
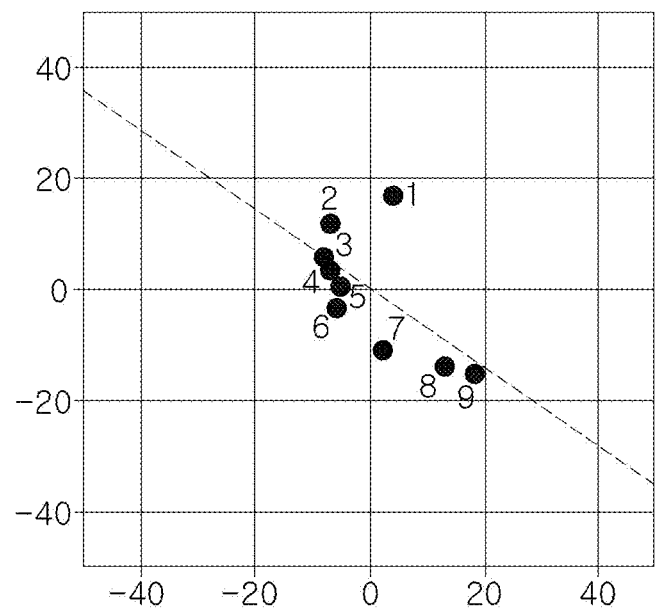
Figure 17:
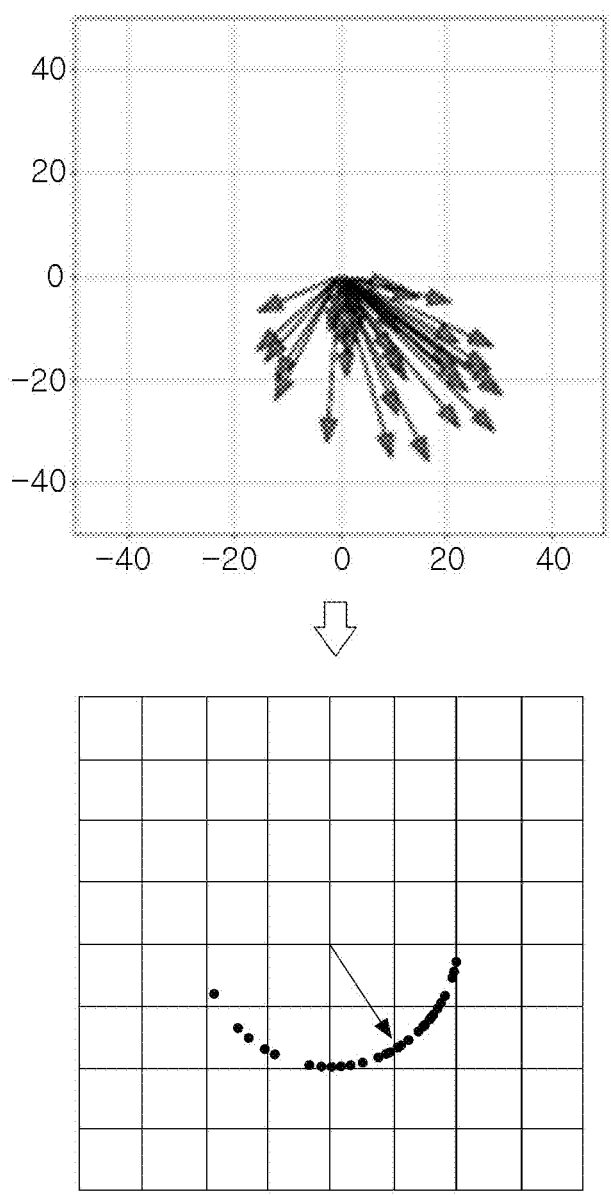
Figure 18:
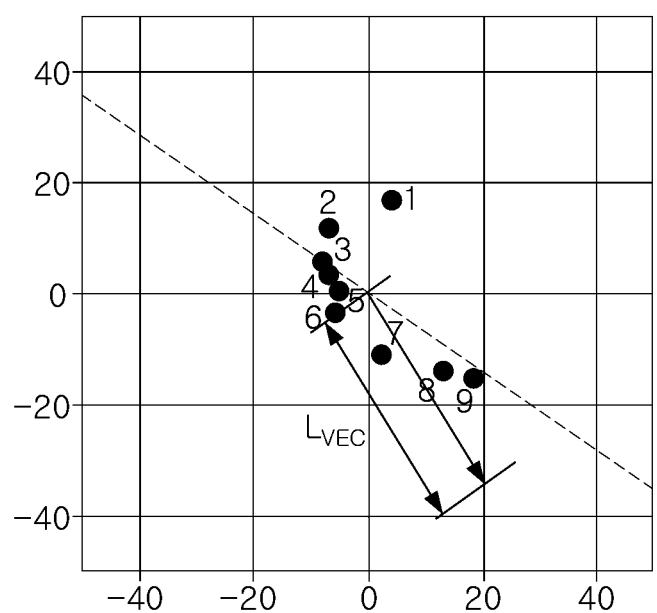

FIGS. 16 to 18 are diagrams illustrating a method of controlling a semiconductor manufacturing device according to an example embodiment.

Referring to FIG. 16, a control unit of a semiconductor manufacturing device may extract feature values from a plurality of kernel images 701 to 709 obtained by repeatedly performing optimization or improvement by a desired (or, alternatively a predetermined) number of times. In the example embodiment illustrated in FIG. 16, it is assumed that the control unit changes a working distance of an objective lens to obtain nine original images and to obtain nine kernel images 701 to 709 from the nine original images. Accordingly, the number of feature values may also be nine. However, the number of the kernel images 701 to 709 and the number of the feature values may vary according to example embodiments.

The control unit may obtain a covariance matrix of a point spread function representing a distribution of an electron beam in each of the kernel images 701 to 709 and may calculate an eigenvalue of the covariance matrix. In an example embodiment, the control unit may obtain a first eigenvalue A1 and a second eigenvalue λ2 from a covariance matrix Σ as illustrated in the following Equation 6.

$$\Sigma = \begin{bmatrix} a & b \\ b & c \end{bmatrix}$$

$$\lambda 1 = \frac{a+c}{2} + \sqrt{\left(\frac{a-c}{2}\right)^2 + b^2}$$

$$\lambda 2 = \frac{a+c}{2} - \sqrt{\left(\frac{a-c}{2}\right)^2 + b^2}$$

[Equation 6]

In Equation 6, the first eigenvalue λ1 may correspond to a major axis of a point spread function, and the second eigenvalue λ2 may correspond to a minor axis of the point spread function. When the first eigenvalue λ1 and the second eigenvalue λ2 are obtained, a two-dimensional (2D) plane in which an X-axis and a Y-axis are defined may be generated as illustrated in the following Equation 7, and feature values 701 to 709 extracted from the kernel images 701 to 709 may be mapped to the 2D plane. As an example, feature values corresponding to the kernel images 701 to 709 may be mapped to a 2D plane, as illustrated in FIG. 16.

$$(x, y) = \left(-\lambda^2 \cos 2\theta, \lambda^2 \sin 2\theta\right)$$

$$\theta = \tan^{-1} \frac{\lambda - a}{b}$$

[Equation 7]

A straight line illustrated in FIG. 16 may be a compensation direction of astigmatism obtained from the feature values mapped to the 2D plane. However, when the compensation direction of the astigmatism is determined from the feature values mapped to the 2D plane as described above, a first feature value, or the like, significantly affected by noise such as blurring occurring in the original image because focus is significantly shifted, may significantly affect the compensation direction. Therefore, it may be difficult to obtain a compensation direction in which astigmatism may be accurately adjusted.

Accordingly, in an example embodiment, a plurality of vectors may be generated using a plurality of feature values as illustrated in FIG. 17. Referring to FIG. 17, the vectors may be vectors connected from an i-th feature value to a j-th feature value, and i may be smaller than j. Therefore, N feature values may be connected to generate N*(N−1)/2 vectors. For example, vectors connected from a first feature value to second to ninth feature values may be generated, and vectors connected from the second feature value to third to ninth feature values may be generated. The generated vectors may be aligned using an origin of the 2D plane as a starting point, and a representative vector VR may be generated by normalizing the aligned vectors. A representative vector VR may be a median vector, and a compensation direction for adjusting astigmatism may be determined as a direction of the representative vector VR.

The control unit may determine a length LVEC of the representative vector VR corresponding to adjustment strength of astigmatism. Referring to FIG. 18, the length LVEC of the representative vector VR may be determined as a variance calculated from coordinates of feature values, for example, a standard deviation. The control unit may adjust current, flowing to stigmators, to adjust astigmatism using the direction and the length LVEC of the representative vector VR. A working distance of an objective lens for focusing may be determined as a working distance of an original image from which a feature value, closest to the origin of the 2D plane, is extracted.

Figure 19:
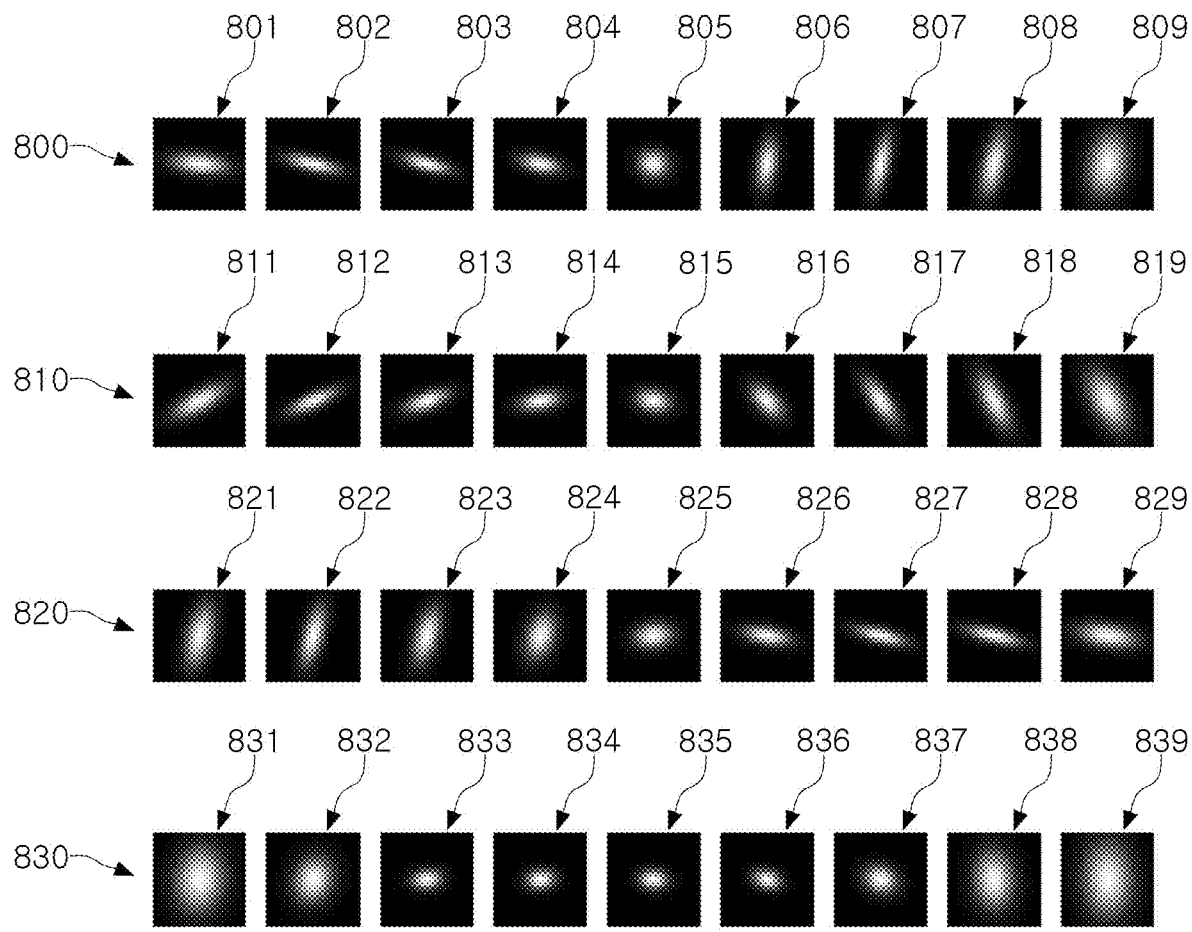
FIGS. 19 and 20 are diagrams illustrating a method of controlling a semiconductor manufacturing device according to an example embodiment.
Figure 20:
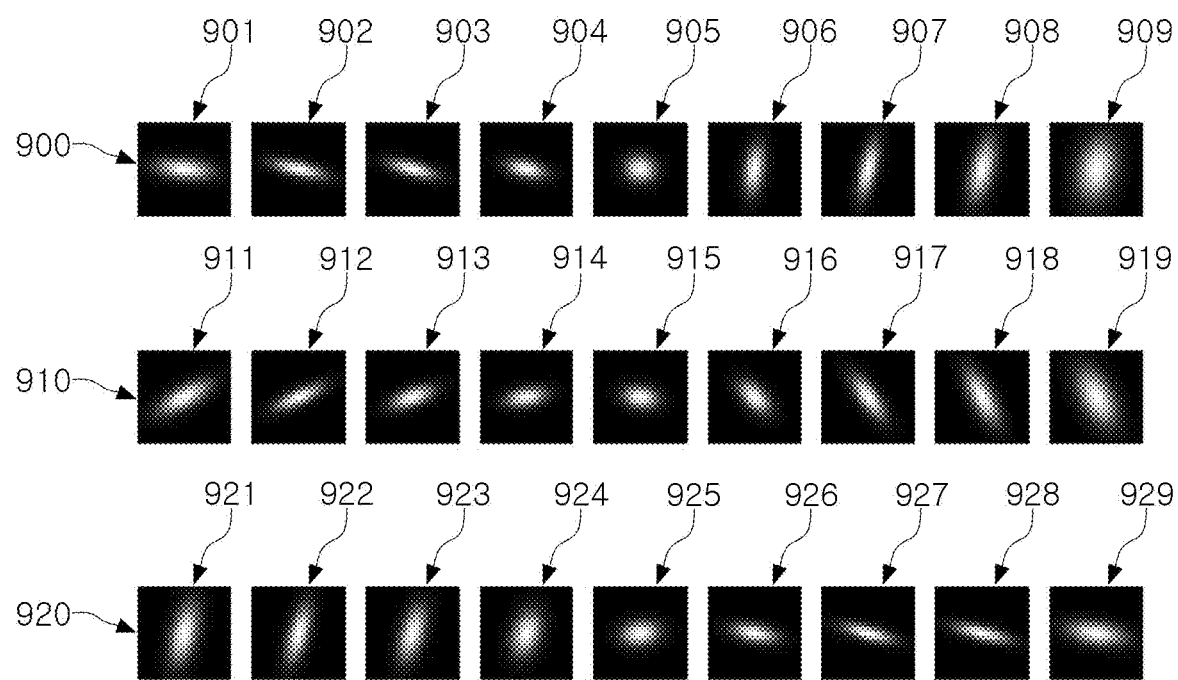

FIGS. 19 and 20 are diagrams illustrating a method of controlling a semiconductor manufacturing device according to an example embodiment.

FIGS. 19 and 20 may be diagrams illustrating a plurality of kernel images extracted from a plurality of original images to be optimized or improved after capturing the plurality of original images under different initial astigmatism conditions. In example embodiments described with reference to FIGS. 19 and 20, a plurality of original images may be obtained in a state in which astigmatism is intentionally generated using a stigmator.

In FIG. 19, kernel images 801 to 809 belonging to a first group 800 may be images extracted from a plurality of original images obtained by generating astigmatism by −1.2% in an X-direction and −1.2% in a Y-direction using a stigmator. For example, the X direction may correspond to the direction D1 and the direction D2 described with reference to FIGS. 4A and 4B, and the Y direction may correspond to the diagonal directions with reference to FIGS. 5A and 5B.

The control unit of the semiconductor manufacturing device may extract feature values from the kernel images 801 to 809 belonging to the first group 800 and may map the extracted feature values to a two-dimensional (2D) plane to obtain compensation data for adjusting a working distance and astigmatism of an objective lens which may obtain an optimal result. In an example embodiment, an optimal working distance in the first group 800 may be determined as a working distance at which a fifth kernel image 805 is obtained.

Kernel images 811 to 819 belonging to a second group 810 may be images extracted from a plurality of original images obtained by generating astigmatism by −1.2% in the X-direction and +1.2% in the Y-direction. Accordingly, a point spread function representing a distribution of an electron beam in the kernel images 811 to 819 may be different from that of the first group 800. Even in the second group 810, the optimal working distance may be a working distance at which the fifth kernel image 815 is obtained.

Kernel images 821 to 829 belonging to a third group 820 may be images extracted from a plurality of original images obtained by generating astigmatism by +1.2% in the X-direction and +1.2% in the Y-direction. Accordingly, a point spread function representing a distribution of an electron beam in the kernel images 821 to 829 may be different from that of each of the first group 800 and the second group 810. Even in the third group 820, an optimal working distance may be a working distance at which the fifth kernel image 825 is obtained. Referring to FIG. 19, a point spread function of the fifth kernel image 825 may have a directionality less than that of a point spread function of the other kernel images 821 to 824 and 826 to 829.

Kernel images 831 to 839 belonging to a fourth group 830 may be images extracted from a plurality of original images obtained in a state in which astigmatism is significantly removed using a stigmator. Accordingly, point spread functions representing a distribution of an electron beam in the kernel images 831 to 839 may have a relatively less directionality. Even in the fourth group 830, an optimal working distance may be a working distance at which the fifth kernel image 835 is obtained. Referring to FIG. 19, the point spread function of the fifth kernel image 835 may be distributed in an area narrower than that of the point spread functions of other kernel images 831 to 834 and 836 to 839.

In the example embodiment described with reference to FIG. 19, a plurality of original images may be obtained while adjusting the working distance of the objective lens within a desired (or, alternatively a predetermined) range. In this case, a working distance corresponding to a focal length may be present in the middle of a corresponding range. On the other hand, in the example embodiment illustrated in FIG. 20, a working distance matching a focal length may not be present in the middle of a corresponding range.

In FIG. 20, kernel images 901 to 909 belonging to a first group 900 may be images extracted from a plurality of original images obtained by generating astigmatism by +1.2% in an X-direction and +1.2% in a Y-direction using a stigmator. The control unit of the semiconductor manufacturing device may extract feature values from the kernel images 901 to 909 belonging to the first group 900 and may map the extracted feature values to a two-dimensional (2D) plane to obtain compensation data for adjusting a working distance and astigmatism of an objective lens which may an optimal result. In an example embodiment, an optimal working distance in the first group 900 may be determined as a working distance at which the sixth kernel image 906, in which a point spread function having a weakest directionality appears, of the first group 900 is obtained.

Kernel images 911 to 919 belonging to a second group 910 may be images extracted from a plurality of original images obtained by generating astigmatism by −1.2% in the X-direction and −1.2% in the Y-direction. An optimal working distance in the second group 910 may be a working distance at which the seventh kernel image 917 is obtained. On the other hand, kernel images 921 to 929 belonging to a third group 920 may be images extracted from a plurality of original images obtained by generating astigmatism by −1.2% in the X-direction and −1.2% in the Y-direction. An optimal working distance in the third group 920 may be a working distance at which the third kernel image 923 is obtained.

Figure 21:
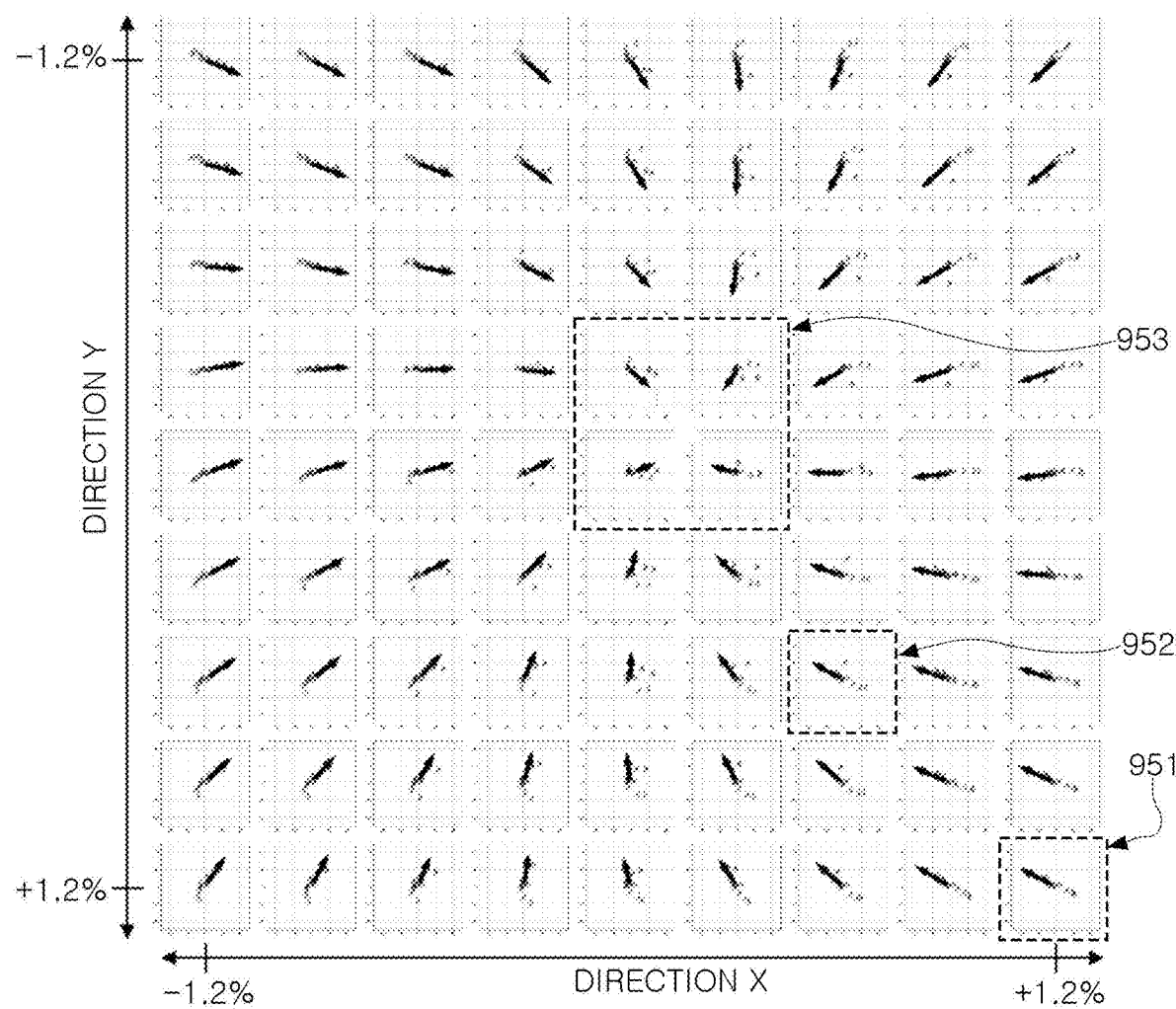
FIG. 21 is a diagram illustrating a method of controlling a semiconductor manufacturing device according to an example embodiment.

FIG. 21 is a diagram illustrating a method of controlling a semiconductor manufacturing device according to an example embodiment.

In an example embodiment illustrated in FIG. 21, a horizontal axis may represent astigmatism in an X direction and a vertical axis may represent astigmatism in a Y direction. Referring to FIG. 21, a plurality of graphs may be arranged in a matrix along the horizontal axis and the vertical axis. Each of the plurality of graphs may be a graph in which feature values extracted from a plurality of kernel images are mapped to a two-dimensional (2D) plane, as described above with reference to FIGS. 16 to 18. For example, each of the plurality of graphs may include feature values, mapped to the 2D plane, and a representative vector calculated from vectors connecting the feature values to each other.

Each of the plurality of graphs may be a graph generated by obtaining a plurality of original images in a state, in which astigmatisms in the X direction and Y direction astigmatism corresponding to coordinates of each graph are present in an objective lens, and extracting a plurality of kernel images from the plurality of original images. As an example, when astigmatism of the objective lens is +1.2% in the X direction and +1.2% in the Y-direction, compensation data for adjusting astigmatism may be determined as in the first graph 951 illustrated in FIG. 21. The control unit of the semiconductor manufacturing device may adjust the astigmatism based on the compensation data of the first graph 951, and may select a working distance corresponding to a feature value closest to an original of the 2D plane, among feature values included in the first graph 951, as a working distance of the objective lens.

After adjusting astigmatism and the working distance of the objective lens with reference to the first graph 951, the control unit may re-obtain a plurality of original images and may extract a plurality of kernel images to obtain compensation data for adjusting astigmatism. As an example, the graph generated by the control unit from the plurality of re-obtained original images and the plurality of kernel images may be the second graph 952 of FIG. 21. The control unit may adjust astigmatism and a working distance of the objective lens with reference to the second graph 952, and may re-obtain a plurality of original images.

By repeatedly performing such an operation, the control unit may automatically remove the astigmatism and may set the working distance of the objective lens to an optimal focal length. As an example, a graph finally generated by the control unit to select a working distance of the objective lens may be one of the third graphs 953.

Figure 22:
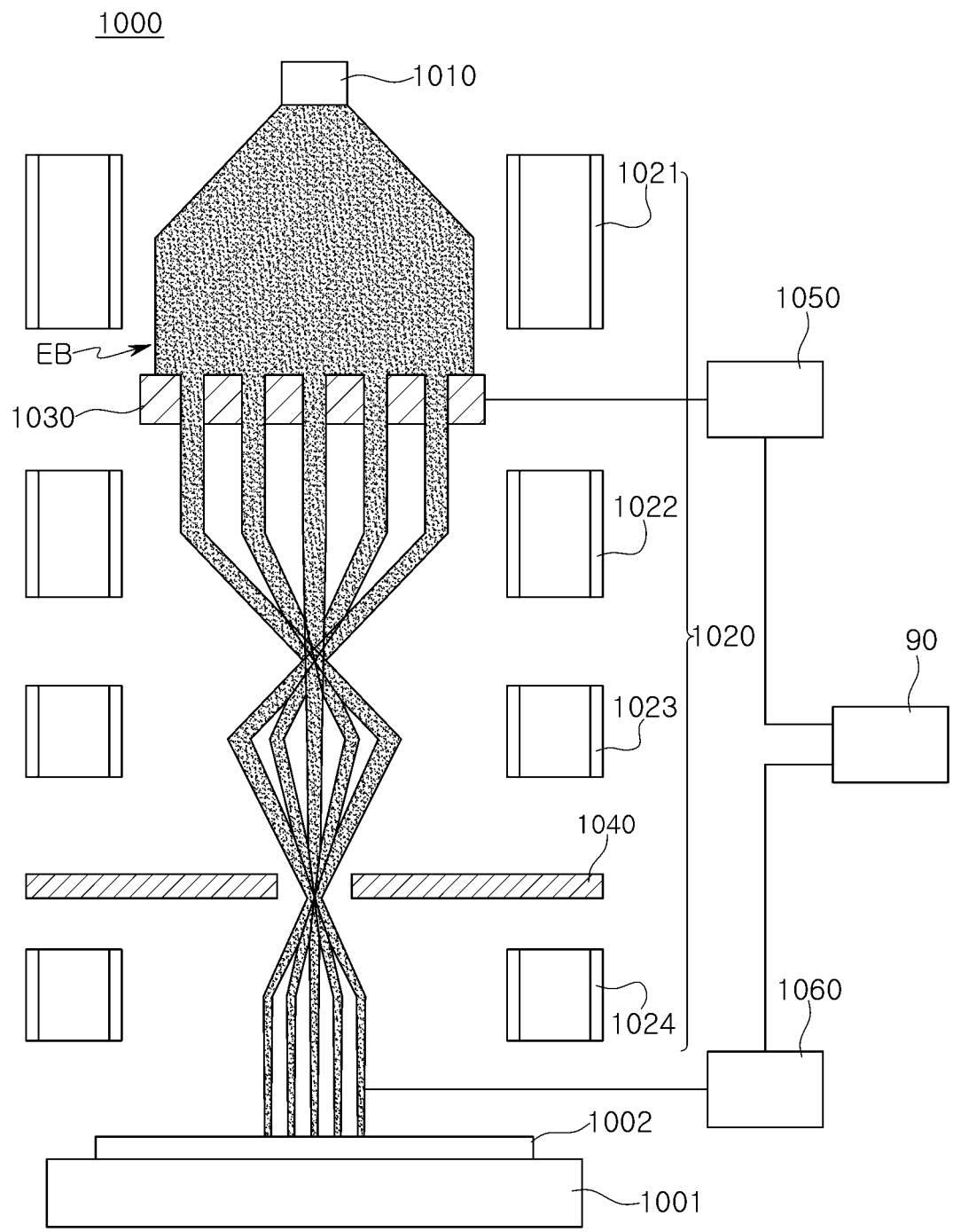
FIG. 22 is a schematic diagram illustrating a semiconductor manufacturing device according to an example embodiment.

FIG. 22 is a schematic diagram illustrating a semiconductor manufacturing device according to an example embodiment.

In an example embodiment illustrated in FIG. 22, a semiconductor manufacturing device 1000 may be an exposure device system using an electron beam. The semiconductor manufacturing device 1000 may include an electron gun 1010 serving as an electron beam source emitting an electron beam EB, a stage 1001 supporting a substrate 1002 to which a resist layer exposed by the electron beam EB is applied, a lens unit 1020 disposed between the electron gun 1010 and the stage 1001 to adjust focus and astigmatism of the electron beam EB, an aperture system having an aperture forming a cross-sectional shape of the electron beam EB, and a deflector 1040.

The semiconductor manufacturing device 1000 may include an adjustment unit 1050 adjusting positions of apertures included in the aperture system 1030, a measurement unit 1060 measuring intensity of the electron beam EB passing through the aperture system 1030, a control unit 1070, and the like. As an example, the control unit 1070 may adjust an alignment state of the apertures, included in the aperture system 1030, or current, flowing to a coil present in the lens unit 1020, to adjust a shape and a distribution of an electron beam irradiated to the substrate 1002.

The electron gun 1010 may be disposed on the stage 1001 on which the substrate 1002 is supported. The electron gun 1010 may include a filament and may irradiate the electron beam EB toward the substrate 1001. The electron beam EB emitted from the electron gun 1010 may be accelerated by an internal acceleration electrode. The electron gun 1010 may include a single electron gun or a plurality of electron guns.

The lens unit 1020 may include first to fourth lens units 1021 to 1024 sequentially arranged from the electron gun 1010. The lens unit 1020 may include a condenser lens and/or a projection lens and may control or focus a path of the electron beam EB.

The control unit 1070 may control current flowing to coils providing a condenser lens in the lens unit 1020 or current flowing to a stigmator for controlling astigmatism. In addition, the control unit 1070 may adjust a working distance, a gap between the lens unit 1020 and the substrate 1002. The control unit 1070 may automatically and simultaneously adjust a working distance and astigmatism, affecting a focus, to be optimized or improved.

The control unit 1070 may intentionally change a working distance to obtain a plurality of original images and may separate a plurality of kernel images from the plurality of original images. As described above, equations for separating a plurality of kernel images may be optimized or improved by a gradient descent method, or the like, to obtain a plurality of kernel images.

The control unit 1070 may extract feature values, which may express a point spread function corresponding to the shape of the electron beam EB irradiated to the substrate 1002, from the plurality of kernel images. As an example, the feature values may include a major axis and a minor axis of the point spread function, and an angle of inclination. The control unit 1070 may map the feature values to a two-dimensional (2D) plane, defined using the feature values, and may generate a representative vector from vectors, connecting the feature values to each other, to obtain compensation data for adjusting astigmatism. At the same time, the control unit 1070 may determine a working distance of the lens unit 1020 which may accurately irradiate the electron beam EB to a desired position of the substrate 1002. Accordingly, the control unit 1070 may automatically adjust the working distance of the lens unit 1020 to match a focal length and may compensate for astigmatism.

As described above, in a device using an electron beam, a plurality of original images may be obtained by changing a working distance between a lens unit and an object, a plurality of kernel images representing a distribution of an electron beam on an object may be extracted from the plurality of original images, and focus and astigmatism of a lens unit may be adjusted using feature values of the plurality of kernel images. Focus and astigmatism, parameters affecting each other, may be simultaneously and automatically adjusted to improve efficiency of a semiconductor process using an electron beam.

While example embodiments have been shown and described above, it will be apparent to those skilled in the art that modifications and variations could be made without departing from the scope of the present inventive concept as defined by the appended claims.

What is claimed is:

1. A scanning electron microscope (SEM) device comprising:
    an electron beam source configured to emit an electron beam;
    a lens unit disposed between the electron beam source and a stage, the stage configured to seat an object including structures having a pattern, the lens unit including a scanning coil configured to generate an electromagnetic field to provide a lens, and the lens unit including an astigmatism adjuster having a plurality of stigmators surrounding the electron beam; and
    a controller including processing circuitry configured to
        change a working distance between the lens unit and the object to obtain a plurality of original images,
        obtain a pattern image, in which the structures appear, and a plurality of kernel images, in which a distribution of the electron beam on the object appears, from the plurality of original images, and
        control, based on feature values extracted from the plurality of kernel images, the astigmatism adjuster to,
            adjust a focus of the lens unit by setting the working distance, and
            adjust an astigmatism of the lens unit by setting currents applied to the plurality of stigmators
    wherein the controller is configured to,
        map the feature values extracted from the plurality of kernel images to a single two-dimensional plane;
        determine a compensation data for controlling the astigmatism adjuster to adjust the astigmatism of the lens unit with reference to a representative vector of vectors connecting some of the feature values to each other; and
    determine the working distance of the lens unit using a feature value closest to an origin of the two-dimensional plane among the feature values.

2. The SEM device of claim 1, wherein in each of the plurality of kernel images, the distribution of the electron beam is represented as a point spread function (PSF) having a Gaussian distribution.

3. The SEM device of claim 2, wherein in at least one of the plurality of kernel images, the distribution of the electron beam is represented as a point spread function having a directionality.

4. The SEM device of claim 3, wherein in some of the plurality of kernel images, the distribution of the electron beam is represented as a point spread function having different directionalities.

5. The SEM device of claim 1, wherein the plurality of original images includes at least one of an over-focused image, obtained by capturing the object in an over-focused state of the lens unit, and an under-focused image obtained by capturing the object in an under-focused state of the lens unit.

6. The SEM device of claim 1, wherein
    each of the plurality of original images corresponds to convolutions of the pattern image and each of the plurality of kernel images, respectively, and the controller is configured to apply a deconvolution operation to each of the plurality of original images to obtain the pattern image and the plurality of kernel images.

7. The SEM device of claim 6, wherein
the controller is configured to obtain a first equation, corresponding to the pattern image, and a second equation by the deconvolution operation,
the distribution of the electron beam appears in each of the plurality of kernel images, and
the controller is configured to adjust the first equation and the second equation to increase a directionality of the distribution of the electron beam between the plurality of kernel images.

8. The SEM device of claim 7, wherein
the controller adjusts the first equation and the second equation using a gradient descent method to obtain the pattern image and the plurality of kernel images.

9. The SEM device of claim 7, wherein the controller is configured to initialize the pattern image to a random noise image.

10. The SEM device of claim 7, wherein the controller is configured to initialize each of the plurality of kernel images to a point spread function having a Gaussian distribution having no directionality.

11. The SEM device of claim 1, wherein
the processing circuitry includes a central processing unit (CPU) and a graphics processing unit (GPU), different from the CPU, and
the GPU is configured to perform an operation to obtain the pattern image and the plurality of kernel images on the object from the plurality of original images.

12. The SEM device of claim 1, wherein the controller is further configured to,
when the feature values are not distributed within a range in the two-dimensional plane, apply the compensation data to the lens unit to re-obtain new original images different from the plurality of original images,
obtain a new pattern image and new kernel images from the new original images, and
adjust the working distance of the lens unit and control the astigmatism adjuster to adjust the astigmatism of the lens unit using new feature values extracted from the new kernel images.

13. The SEM device of claim 1, wherein the controller is further configured to, when the feature values are distributed within a range in the two-dimensional plane, apply the determined working distance and the compensation data to the lens unit to obtain an image for a target area of the object.

14. The SEM device of claim 1 12, wherein the controller is configured to determine a length of the representative vector corresponding to adjustment strength of astigmatism using a variance calculated from coordinates of the feature values.

15. A scanning electron microscope (SEM) device comprising:
an electron beam source configured to emit an electron beam to an object;
a lens unit between the object and the electron beam source, the lens unit including an astigmatism adjuster having a plurality of stigmators surrounding the electron beam; and
a controller including processing circuitry configured to
change a working distance between the lens unit and the object to obtain a plurality of original images,
obtain a plurality of kernel images, in which a distribution of the electron beam focused on the object is represented in a form of a point spread function, from the plurality of original images, and
adjust a focus of the lens unit by setting the working distance based on feature values extracted from the plurality of kernel images, and
adjust an astigmatism of the lens unit by setting currents applied to the plurality of stigmators based on the feature values extracted from the plurality of kernel images
wherein the controller is configured to define a covariance of the point spread function having a Gaussian distribution as a matrix in each of the plurality of kernel images, and obtain a major axis representing a shape of the point spread function and an angle of inclination as the feature values using an eigenvalue of the matrix.

16. The SEM device of claim 15, wherein the processing circuitry includes a graphics processing unit including a plurality of cores configured to simultaneously process the plurality of original images and the plurality of kernel images.

17. The SEM device of claim 15, wherein a first point spread function represented in a first kernel image among the plurality of kernel images has a shape rotated by 90 degrees with respect to a second point spread function represented in a second kernel image among the plurality of kernel images.

18. The SEM device of claim 15, wherein the controller is configured to
map the features values obtained in the plurality of kernel images to a two-dimensional plane having a horizontal axis and a vertical axis defined based on the major axis and the angle of inclination; and
adjust the working distance and the astigmatism with reference to a distribution of the feature values.

* * * * *